United States Patent
Ogawa et al.

(10) Patent No.: US 10,312,122 B2
(45) Date of Patent: Jun. 4, 2019

(54) SUBSTRATE STORAGE CONTAINER

(71) Applicant: Shin-Etsu Polymer Co., Ltd., Tokyo (JP)

(72) Inventors: Osamu Ogawa, Saitama (JP); Kiminori Tominaga, Niigata (JP); Yasuhiro Fujimoto, Niigata (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 0 days.

(21) Appl. No.: 15/329,078

(22) PCT Filed: Jul. 21, 2015

(86) PCT No.: PCT/JP2015/070655
§ 371 (c)(1),
(2) Date: Jan. 25, 2017

(87) PCT Pub. No.: WO2016/013536
PCT Pub. Date: Jan. 28, 2016

(65) Prior Publication Data
US 2017/0213752 A1 Jul. 27, 2017

(30) Foreign Application Priority Data
Jul. 25, 2014 (JP) .................................. 2014-151855

(51) Int. Cl.
*H01L 21/673* (2006.01)
(52) U.S. Cl.
CPC .. *H01L 21/67386* (2013.01); *H01L 21/67389* (2013.01); *H01L 21/67393* (2013.01)
(58) Field of Classification Search
CPC . Y10S 414/137; Y10S 414/139; H01L 23/467
(Continued)

(56) References Cited

U.S. PATENT DOCUMENTS

2001/0011640 A1* 8/2001 Suzuki ............. H01L 21/67366
  205/765
2011/0114534 A1* 5/2011 Watson ............. H01L 21/67393
  206/710
(Continued)

FOREIGN PATENT DOCUMENTS

JP   H09-134952 A    5/1997
JP   2002-122382 A   4/2002
(Continued)

OTHER PUBLICATIONS

International Preliminary Report on Patentability (IPRP) and Written Opinion issued in International Application No. PCT/JP2015/070655 dated Feb. 9, 2017 (10 pages).
(Continued)

*Primary Examiner* — Allan D Stevens
(74) *Attorney, Agent, or Firm* — Osha Liang LLP

(57) ABSTRACT

The substrate storage container includes a container main body, an air feed valve, and an air replacement unit. The container main body is formed in a front open box form with the air feed valve attached to the rear of the bottom plate. The air replacement unit includes a housing and a cover that covers the open front of the housing. The bottom of the housing is connected to the air feed valve so as to flow the purge gas while the housing is supported at the upper portion thereof by a rear wall of the container main body. Either the housing or the cover is formed with a plurality of blow holes for blowing the purge gas toward the front of the container main body.

7 Claims, 19 Drawing Sheets

(58) Field of Classification Search
USPC .......................................... 206/710, 711, 712
See application file for complete search history.

(56) References Cited

U.S. PATENT DOCUMENTS

| 2013/0213442 | A1* | 8/2013 | Kaise | ................ | H01L 21/67393 |
| | | | | | 134/22.18 |
| 2015/0235885 | A1* | 8/2015 | Iwamoto | ........... | H01L 21/67389 |
| | | | | | 53/86 |
| 2016/0118282 | A1* | 4/2016 | Maraschin | ........ | H01L 21/67769 |
| | | | | | 414/222.07 |

FOREIGN PATENT DOCUMENTS

| JP | 2002-170876 A | 6/2002 | | |
| JP | 2004-327911 A | 11/2004 | | |
| JP | 3960787 B2 | 8/2007 | | |
| JP | 4201583 B2 | 12/2008 | | |
| JP | 2013-513951 A | 4/2013 | | |
| WO | WO 2013015481 A1 * | 1/2013 | ....... | H01L 21/67393 |

OTHER PUBLICATIONS

International Search Report issued in PCT/JP2015/070655, dated Oct. 13, 2015 (2 pages).
Written Opinion of the International Searching Authority issued in PCT/JP2015/070655, dated Oct. 13, 2015 (6 pages).

* cited by examiner

SUBSTRATE STORAGE CONTAINER

TECHNICAL FIELD

The present invention relates to a substrate storage container which allows the interior air to be replaced with a substrate protecting gas in a state that the door unit is being detached from the container main body.

BACKGROUND ART

The conventional substrate storage container such as Front Opening Unified Pod (FOUP) includes, as partly shown in FIGS. 23 and 24, a container main body 1 for accommodating a plurality of semiconductor wafers W in alignment and a door unit that is attachably and removably fitted to an open front 2 of the container main body 1. The container main body 1 is equipped with a plurality of air feed valves and air release valves which enable replacement of air inside the container main body 1 with a purge gas for semiconductor wafers W to protect semiconductor wafers W.

The container main body 1 is formed to have a front open box configuration having an open front 2, and is mounted in position with a load port 81 equipped with a purging device. The door unit is fitted to and removed from the open front 2 by this load port 81. Arranged and fitted at both sides in the rear part of a bottom plate 6 of the container main body 1 are air feed valves for supplying a purge gas for semiconductor wafers W (see the arrows in FIGS. 23 and 24) from the outside to the inside of the container main body 1. Air release valves that exhaust air from the interior to the exterior of the container main body 1 when the purge gas for semiconductor wafers W are supplied are arranged and fitted at both sides in the front part of the bottom plate 6 (see Patent Document 1).

As the purge gas for semiconductor wafers W, inert gases (nitrogen gas etc.) for inhibiting deterioration of the surface conditions of semiconductor wafers W and corrosion of wires, and dry gas can be mentioned, for example. Each air feed valve is optionally connected to a hollow tower nozzle 70 when the air is required to be efficiently replaced with purge gas. This tower nozzle 70 is given as, for example a vertically extended elongate hollow cylindrical form, fixed to the bottom plate 6 of the container main body 1 to communicate with the air feed valve, and has a plurality of blow holes 71 for blowing out purge gas toward the front 2 of the container main body 1, perforated in rows vertically on the peripheral wall thereof (see Patent Document 2).

In a typical substrate storage container, the air is replaced by purge gas in a condition where the container main body 1 is confined when the front 2 of the container main body 1 is fitted with a door unit. Recently, however, replacement with purge gas has come to be performed during processing semiconductor wafers W by processing equipment so as to prevent degeneration of the surface conditions of semiconductor wafers W. In this case, the substrate storage container is mounted on a module called EFEM (Equipment Front End Module) 80, and the door unit is removed from the front 2 of the container main body 1, then the air is replaced with purge gas in the state where the front 2 of the container main body 1 is open (see Patent Document 3).

The EFEM 80 is a transport system that is constructed of a loadport 81, wafer transport mechanism and wafer transport chamber, to perform a semiconductor manufacturing process up to supplying semiconductor wafers W loaded from the load port 81 to the production equipment. Arranged in the ceiling of this EFEM 80 is a fan filter unit (FFU) 82, which blows a large quantity of clean air down toward the floor as indicated by the arrows.

In the above configuration, when the relative humidity inside the container main body 1 of the substrate storage container is desired to be uniformly lowered to a certain level or below by replacement of air with purge gas using the EFEM 80, the container main body 1 of the substrate storage container is set on the load port 81 of EFEM 80, the door unit is removed from the front 2 of the container main body 1, then purge gas is supplied at high pressure from the outside to the inside of the container main body 1 while a large quantity of clean air is blown downwards to the floor from the fan filter unit 82 at the ceiling of EFEM 80.

As a result, the purge gas flows into the tower nozzle 70 through the air feed valves of the container main body 1 and blows out from a plurality of blow holes 71 of the tower nozzle 70 toward the open front 2 of the container main body 1 while flowing from the rear to the front passing through between and in contact with a plurality of semiconductor wafers W. Thus, the air inside the container main body 1 is discharged from the front 2 of the container main body 1 to the outside by the air flow to thereby reduce the relative humidity inside the container main body 1.

PRIOR ART DOCUMENTS

Patent Documents

Patent Document 1:
　Japanese Patent No. 4201583
Patent Document 2:
　Japanese Patent No. 3960787
Patent Document 3:
　Japanese Patent Application Laid-open No. 2004-327911

SUMMARY OF THE INVENTION

Problems to be Solved by the Invention

The conventional substrate storage container is configured as state above. Since when the tower nozzle 70 is optionally connected to the air feed valve, a plurality of blow holes 71 are simply perforated in the elongated tower nozzle 70, it is considered that there is a fear that efficient replacement of the air inside container main body 1 with purge gas is hindered. Further, since the tower nozzle 70 is simply fixed in the rear part of the bottom plate 6 of the container main body 1 and the upper part of the tower nozzle 70 is free, it is considered that there is a fear that efficient replacement of the air inside container main body 1 with purge gas is hindered.

Describing this respect in detail, under the condition that the upper part of the tower nozzle 70 is free, when purge gas is fed at high pressure from the outside to the interior of the container main body 1 or when the substrate storage container is transported at high speed, the upper part of the tower nozzle 70 sways back and forth and left and right due to vibration and acceleration, so that the posture of the tower nozzle 70 becomes unstable. This instability in posture of the tower nozzle 70 induces loose fixing of the tower nozzle to the bottom plate 6 of the container main body 1 and/or displacement of blow holes 71 of the tower nozzle 70 in the peripheral direction from the original set position, hence there may occur the risk that efficient replacement of the air inside container main body 1 with purge gas is becomes difficult.

When replacement with purge gas and uniform reduction in relative humidity in the substrate storage container to be equal to or lower than a certain level is desired by use of the EFEM 80, a large quantity of clean air is blown down from the ceiling, hence excellent effect can be expected. However, during air blowing down, part of clean air can enter the lower area near the open front of the container main body 1 and collide with the purge gas from the tower nozzle 70, generating stagnation S (see FIG. 2). This generation of stagnation S blocks reach of the purge gas from the tower nozzle 70 to the bottom area near the open front of the container main body 1, hence the distribution of relative humidity becomes uneven between around the bottom area inside the container main body 1 and in the other part. As a result, there occurs the problem that the relative humidity inside the container main body 1 cannot be lowered uniformly.

Further, in some cases depending on the usage and environment of EFEM 80, part of clean air can enter the upper area near the open front of the container main body 1 and collide with the purge gas from the tower nozzle 70, forming stagnation S (see FIG. 24). Also in this case, the purge gas from the tower nozzle 70 is prevented from reaching the upper area near the open front of the container main body 1, hence the distribution of relative humidity becomes uneven between around the upper part inside the container main body 1 and in the other part. As result, there occurs the problem that the relative humidity inside the container main body 1 cannot be lowered uniformly. This problem is particularly serious because the space between the ceiling plate 16 of the container main body 1 and the topmost semiconductor wafer W is wide, hence difficult to fill with purge gas using the tower nozzle 70.

The present invention has been devised in view of what has been discussed above, it is therefore an object of the invention to provide a substrate storage container that enables efficient replacement of the air inside the container main body with a substrate protecting gas. It is another object of the present invention to provide a substrate storage container that can lower the humidity inside the container main body appropriately when air replacement with substrate protecting gas is performed with the front of the container main body open.

Means for Solving the Problems

In order to solve the above problem, the present invention provides a substrate storage container comprising: a container main body capable of accommodating a plurality of substrates; an air feed valve for supplying a substrate protecting gas from an outside of the container main body to an inside of the container main body; and, an air replacement unit that blows out the substrate protecting gas from the air feed valve into the inside of the container main body, wherein the container main body has a front open box form with the air feed valve attached at a bottom in a rear part of the container main body, the air replacement unit includes a housing member for reserving the substrate protecting gas flowed in through the air feed valve and a covering member that covers an open face of the housing member, a bottom of the housing member is connected to the air feed valve so as to flow the substrate protecting gas, and either the housing member or the covering member is formed with a plurality of blow holes for blowing the substrate protecting gas in the housing member toward a front of the container main body.

Here, a front face of the housing member of the air replacement unit may be formed to be open, and the open front face of the housing member may be directed toward the front of the container main body and covered with the covering member while the plurality of blow holes may be formed in the covering member.

Also, the open front of the housing member of the air replacement unit may be directed toward the rear wall of the container main body so that the closed rear wall of the housing is directed to the front of the container main body while a plurality of blow holes may be formed in the rear wall of the housing member and the front of the housing member may be covered with an unperforated covering member.

Further, it is possible to provide a container configuration in that the container main body is formed to be able to accommodate the plurality of substrates arranged over one another, and at least, a rear wall of the container main body is made transparent, the housing member of the air replacement unit is formed to extend in a vertical direction of the container main body and sized so as to be able to face, at least, the most part of the rear wall of the container main body, an interior of the housing member is sectioned into a plurality of reserving spaces, an observation window for inspection of substrates is formed between the plurality of reserving spaces, the plurality of reserving spaces are connected at least one of an upper position and a lower position so as to allow the substrate protecting gas to flow, and, the covering member of the air replacement unit is formed with a cutout corresponding to the observation window of the housing member and has the plurality of blow holes arrayed vertically and horizontally of the covering member.

It is preferable that at least one of a top and a middle of the housing member of the air replacement unit is supported by the interior of the container main body.

Further, it is possible to provide such a configuration that the air replacement unit includes an airflow regulating member that faces, at least, a ceiling among the bottom and ceiling of the container main body so as to regulate a clearance between the airflow regulating member and the ceiling, the clearance regulated by the airflow regulating member is made to communicate with the space between the inner side of the rear wall of the container main body and the housing member, forming an air flow path, and among the plurality of blow holes of the covering member, a position of lower blow holes is adjusted so that the substrate protecting gas will not touch an underside surface of the substrate located at a lower-most position.

Also, of the plurality of blow holes of the air replacement unit, a position of upper blow holes may be adjusted so that the substrate protecting gas will not touch an upside surface of the substrate located at a topmost position.

It is also possible to provide such a configuration that the air replacement unit is formed of electrical conducting material and a connecting portion of the air replacement unit coming into contact with the container main body enables static electricity on the air replacement unit to be grounded to the outside of the container main body.

It is also preferable that the air replacement unit is formed of electrical conducting material and the surface resistance of the air replacement unit is specified to fall within a range of $10^3$ to $10^{12} \Omega$.

The air replacement unit may preferably include an air permeable filtering member interposed between the housing member and the covering member.

Further, when an air feed hole for the air feed valve is formed in the rear bottom of the container main body and a hollow offset adaptor is interposed between the air feed valve and the air feed hole with its upper part fitted into the air feed hole, it is possible to connect the upper part of the offset adaptor and the conduit sleeve projected from the bottom of the housing member of the air replacement unit, via a sealing material.

Moreover, it is also possible to provide such a configuration that an engaging piece for the air replacement unit is formed at the upper part on the inner side of the rear wall of the container main body so as to be directed toward the front of the container main body while an engagement piece engaged with the engagement piece on the rear wall of the container main body is formed in the upper part of the periphery of the observation window of the housing member.

The air replacement unit may include an airflow regulating member that is provided for the housing member and extends aslant toward the side wall of the container main body, the front end of the air flow regulating member may be made close to the side wall of the container main body with keeping a clearance.

Further, the airflow regulating member of the air replacement unit may be formed with an air guide having a V-shape in top view, and the flexed part of the guide may be directed to the rear wall of the container main body.

Herein, the substrates in the scope of claims, at least, include a necessary number of semiconductor wafers, glass wafers, mask glasses and others of 200, 300 or 450 mm in diameter. The container main body and the air replacement unit may be transparent, opaque or translucent. A contact projection for establishing connecting conduction between the container main body and the air replacement unit may be provided for, at least, one of the container main body, the housing member of the air replacement unit and the covering member. It is preferable that the container main body is mounted on the EFEM, put with its front open and blown with clean air flowing down from above while a substrate protecting gas is supplied to the air feed valve at the bottom from the outside.

The door unit may be attachably and detachably fitted to the open front of the container main body. This door unit may be formed of a door body to be fitted into the front of the container main body and a front plate covering the open front of the door body. A locking mechanism for the door unit can be put between the door body and the front plate. The housing member of the air replacement unit can be supported at the upper portion and center portion, the upper portion or the center portion thereof by the interior (the inner face of the rear wall, the inner face of the side wall, the inner face of the ceiling) of the container main body.

When the air replacement unit is made conductive, it is preferable that at least one of the container main body and the air feed valve is made conductive. The covering member of this air replacement unit may be either fixed, or attachably and detachably attached, to the open front of the housing member. The plurality of blow holes may be perforated in the housing member or the covering member, either regularly or irregularly. Further, the airflow regulator may be provided in either singular or plural. In this case, the individual airflow regulating member may be arranged opposite to each other so as to define a clearance between itself and the bottom of the container main body and between itself and the ceiling of the container main body.

According to the present invention, since the housing member of the air replacement unit can be arranged in the wide space on the rear wall side of the container main body so as to blow a substrate protecting gas from the plurality of blow holes of the air replacement unit toward the front of the container main body, it is possible to efficiently replace the air inside the container main body with the substrate protecting gas while preventing air collision and air stagnation.

Further, since the air feed valve of the container main body is made to connect and support the bottom of the housing member of the air replacement unit while at least one of the upper part and the center part of the housing member can be supported by the container main body, the upper part of the air replacement unit will hardly sway and become unstable even if the substrate storage container is vibrated and accelerated by supply of the substrate protecting gas from the outside to the inside of the container main body and by high speed transportation.

Advantages of the Invention

According to the invention of claim 1 or 2, since the substrate protecting gas can be blown in the wide area inside the container main body while the air replacement unit can be kept stable in posture, this configuration is effective in efficiently replacing the air inside the container main body with the substrate protecting gas.

According to the invention of claim 3, since, at least, the rear wall of the container main body is made transparent while an observation window for inspection of substrates is formed between the plurality of reserving spaces in the air replacement unit and the covering member is formed with a cutout corresponding to the observation window, it is possible to properly and easily observe the conditions of the substrates stored in the container main body from the outside.

Further, since the housing member is made to face, at least, the most part of the rear wall of the container main body and a plurality of blow holes are arrayed horizontally and vertically in the covering member, it is possible to blow and circulate the substrate protecting gas over the wide range inside the container main body and make the gas into contact with the substrates. Further, since the interior of the housing member is sectioned into the plurality of reserving spaces and the plurality of reserving spaces are connected by at least one of an upper connection and lower connection so as to flow the substrate protecting gas therebetween, it is possible to expect stabilization of the substrate protecting gas flowing in from the air feed valves and uniformizing of the amount of substrate protecting gas.

According to the invention of claim 4, the housing member of the air replacement unit is supported at least one of the upper part and the center part thereof by inside of the container main body, it is possible to prevent the air replacement unit from becoming unstable in posture if vibrations and acceleration is applied due to, for example, supply of the substrate protecting gas at high pressure from the outside to the inside of the container main body or high speed transportation of the substrate storage container.

According to the invention of claim 5, even if clean air flows in from the open front of the container main body when clean air is blown downward from above with the front of the container main body open, the clean air can be guided passing from the lower interior of the container main body through the air flow path located outside the substrate storage space to be discharged outside of the container main body. Since the function of this air flow path can reduce the risk of generation of air stagnation due to collision of clean air with the substrate protecting gas from the air replacement unit, it is possible to fill the lower space near the front of the container main body with the substrate protecting gas from the air replacement unit, hence reduce the relative humidity inside the container main body approximately uniformly to a certain level or below.

According to the invention of claim 6, since the substrate protecting gas flows without touching the upside surface of the topmost substrate, the substrate protecting gas hardly collides and mixes with the clean air that flows over the upside surface of the topmost substrate and flows inside the container main body, and hardly generates air stagnation. Accordingly, it is possible to fill the upper space near the front of the container main body with the substrate protecting gas from the air replacement unit so as to make the relative humidity of the upper part inside the container main body uniform with that of the remaining part, hence reduce the relative humidity inside the container main body approximately uniformly to a certain level or below.

According to the invention of claim 7, since the air replacement unit is formed of electrical conducting material and a connecting portion of this air replacement unit with the container main body is provided to ground static electricity on the air replacement unit to the outside of the container main body, it is possible to prevent static electricity from building up on the air replacement unit and dissipate static charge even if a purging operation with purge gas takes a long time. Therefore, it is possible to prevent from adsorption of dust by electrification and reduce the pollution of the substrates.

According to the invention of claim 8, since the air replacement unit is formed of electrical conducting material and the surface resistance thereof is specified to fall within the range of $10^3$ to $10^{12} \Omega$, it is possible to more reliably reduce the risk of inducing pollution of substrates as a result of adsorption of dust by electrification of the air replacement unit due to its vibrations caused by purge gas during purging.

According to the invention of claim 9, since the filtering member can remove pollutants in the substrate protecting gas reserved in the housing member, it is possible to keep clean environment if the substrate protecting gas is blown out from the blow holes of the covering member, hence the substrates are hardly polluted.

MODE FOR CARRYING OUT THE INVENTION

Figure 1:
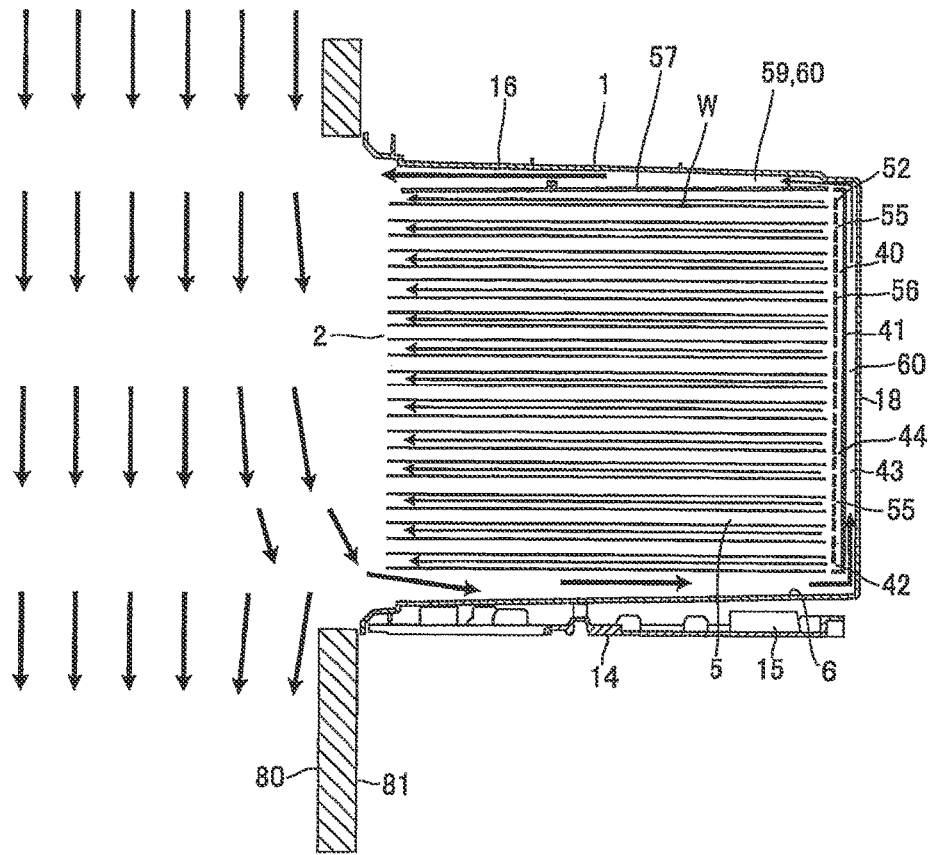
FIG. 1 A cross-sectional illustration schematically showing a state where clean air flows into the lower part near the open front of a container main body in the embodiment of a substrate storage container according to the present invention.

Next, a preferred embodiment of the present invention will be described with reference to the drawings. The substrate storage container in the present embodiment includes: as shown in FIGS. 1 to 18, a container main body 1 capable of storing a plurality of semiconductor wafers W; a door unit 30 attachably and detachably fitted to an open front 2 of the container main body 1; a locking mechanism 36 for locking the door unit 30 fitted to the front 2 of the container main body 1; and an air replacement unit 40 that blows out to the interior of the container main body 1 a purge gas for semiconductor wafers W as a substrate protecting gas supplied to the interior of the container main body 1. In the substrate storage container, the upper part of a housing 41 of the air replacement unit 40 is supported inside the container main body 1 while a plurality of blow holes 55 for blowing out purge gas are perforated in a cover 52 of the air replacement unit 40.

Figure 2:
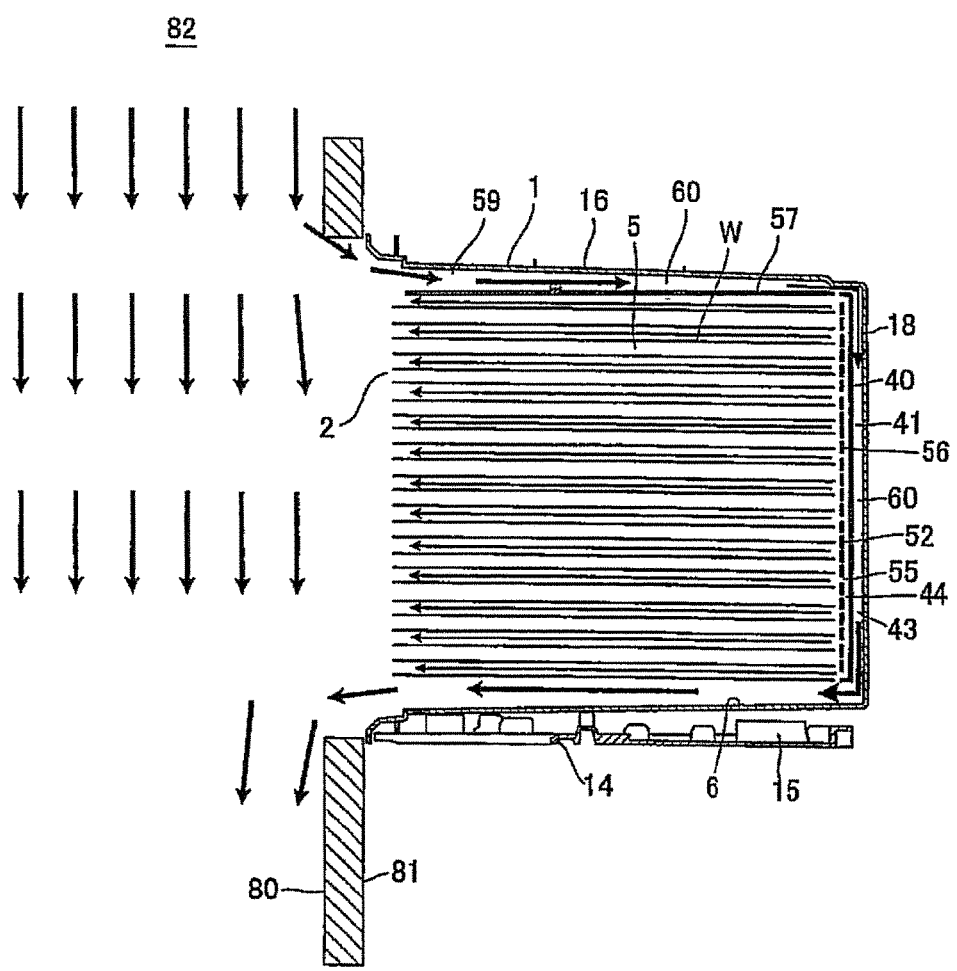
FIG. 2 A cross-sectional illustration schematically showing a state where clean air flows into the upper part near the open front of the container main body in the embodiment of the substrate storage container according to the present invention.
Figure 4:
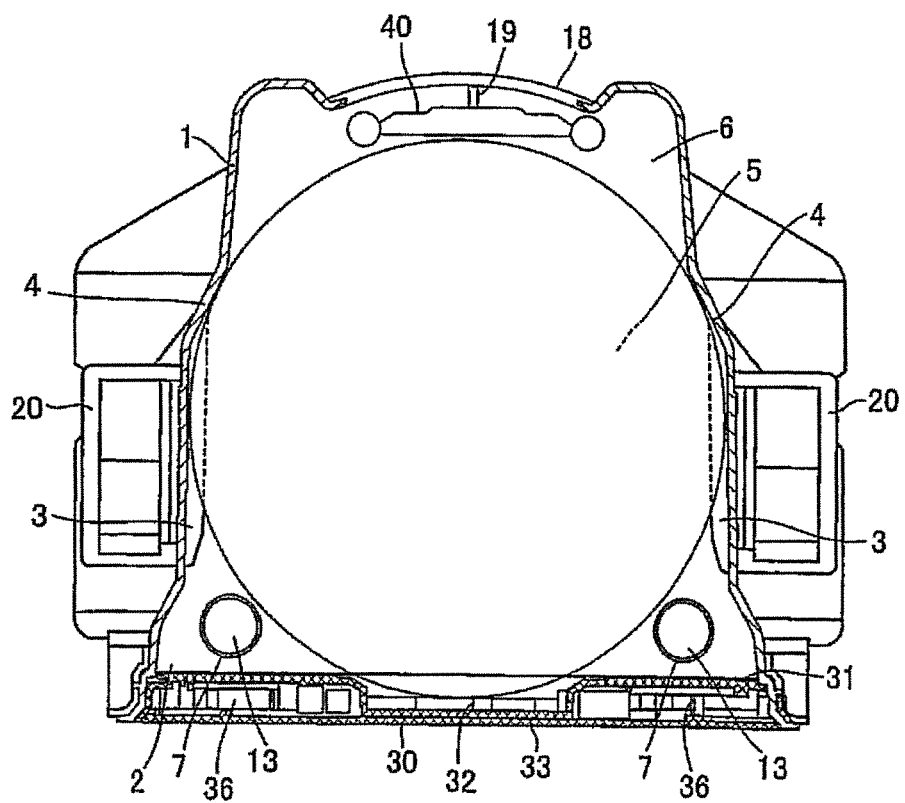
FIG. 4 A sectional plan view schematically showing the embodiment of the substrate storage container according to the present invention.
Figure 5:
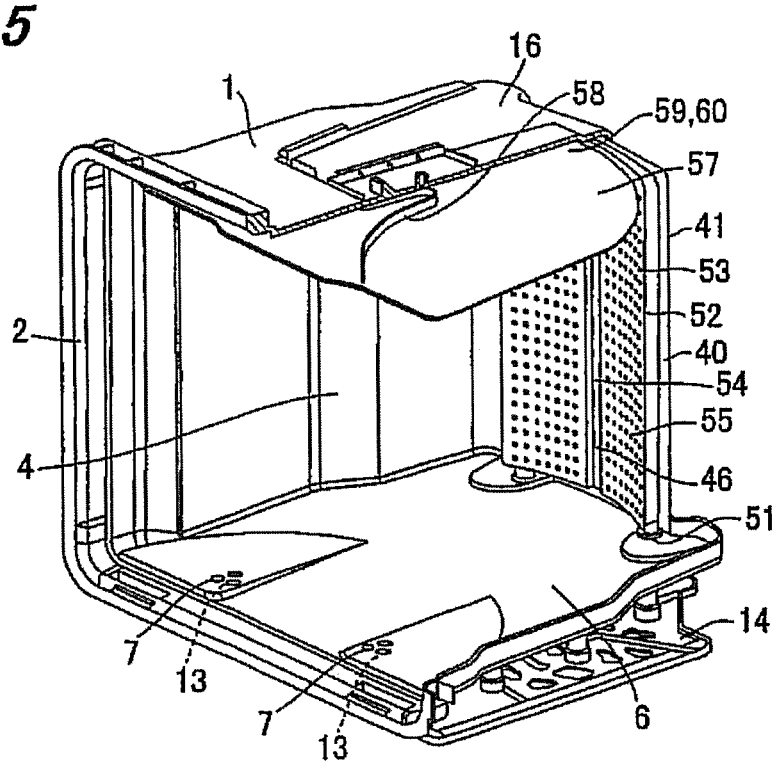
FIG. 5 A perspective illustration of the embodiment of the substrate storage container according to the present invention, schematically showing a state where part of an unfinished container main body is cut away.
Figure 6:
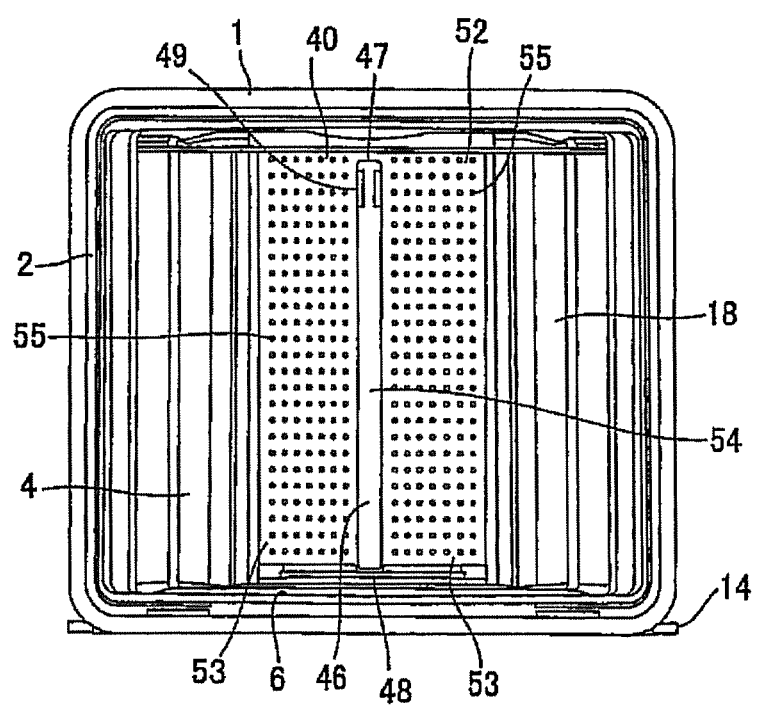
FIG. 6 A front illustration of the embodiment of the substrate storage container according to the present invention, schematically showing an unfinished container main body.
Figure 7:
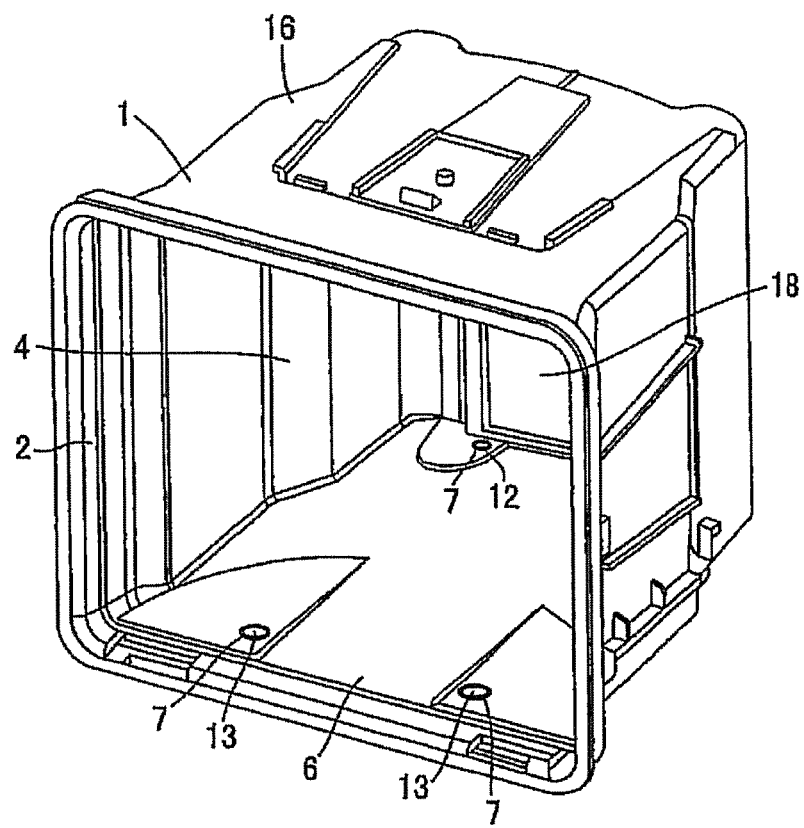
FIG. 7 A perspective illustration of the embodiment of the substrate storage container according to the present invention, schematically showing an unfinished container main body.

As shown in FIGS. 1, 2 and 4, each semiconductor wafer W is a silicon wafer of 775 μm thick with a diameter of 300 mm, for example, and subjected to various shaping and processing as appropriate in semiconductor part manufacturing processes (including as many as 500 to 600 steps). The semiconductor wafer W is horizontally inserted into and stored in a substrate storage space 5 sectioned inside the container main body 1, 25 wafers being accommodated and arranged vertically in alignment at regular intervals.

As to the container main body 1, door unit 30 and locking mechanism 36, a plurality of parts are formed by injection molding of molding material containing necessary resins, and the plurality of parts are assembled to configure each. Examples of the resins contained in the molding material may include thermoplastic resin such as cycloolefin polymers, cycloolefin copolymers, polycarbonate, polypropylene, polyether imide, polyether ketone, polyether ether ketone, polybutylene terephthalate, polyacetal, liquid crystal polymers and alloys of these. Of these resins, cycloolefin polymers are preferably used when the resin is required to have transparency, low impurity and other properties.

As shown in FIGS. 1 to 10, the container main body 1 is molded in a front open box form having an open front 2, and is sometimes gripped and transported with the open front 2 kept horizontally oriented, from one process to another by an overhead transport system in the semiconductor manufacturing plant, and is mounted other times in position to a load port 81 of an EFEM 80 for downward blowing a large quantity of clean air (see the arrows in FIGS. 1 and 2) from a fan filter unit 82 at ceiling towards the floor.

The container main body 1 has pairs of left and right support pieces 3 formed on both sides therein or on the interior surface of the both side walls so that the corresponding left and right support pieces 3 are facing each other to substantially horizontally support semiconductor wafers W and also has position regulators 4 formed in the rear part on the interior surface of the both side walls to restrict excessive insertion of semiconductor wafers W, both being formed integrally. Pairs of left and right support pieces 3 are arranged vertically with a predetermined pitch in a vertical direction of the container main body 1, each support piece 3 being given in an elongated plate-like form for supporting the side peripheral edge of semiconductor wafer W and having a step integrally formed on the top face in the front part thereof to prevent the semiconductor wafer W from rushing forwards.

As shown in FIGS. 1 and 2, these plurality of support pieces 3 divide the substrate storage space 5 into sections in the most part inside the container main body 1. Of the plurality of support pieces 3, the topmost pair of support pieces 3 may be either used or not used to support a dummy wafer having approximately the same size as the semiconductor wafer W, as required.

Figure 8:
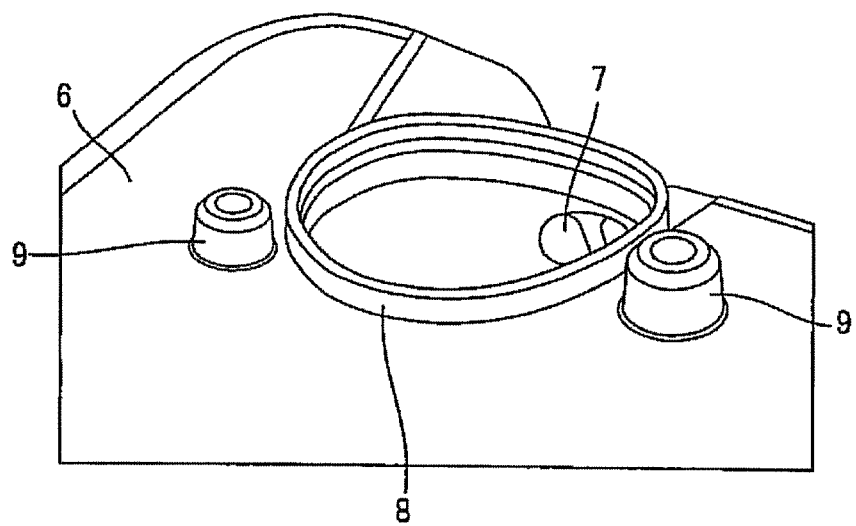
FIG. 8 A perspective illustration viewed from below schematically showing an area near an attachment hole in the container main body in the embodiment of the substrate storage container according to the present invention.

Attachment holes 7 are bored at the front and rear on both sides in the bottom plate 6 of the container main body 1 so that air feed valves 10 and air release valves 13 for air replacement are fitted to these plurality of attachment holes 7. These plurality of air feed valves 10 and air release valves 13 circulate gases such as air, purge gas and others inside and outside the container main body 1 to thereby eliminate pressure difference between the inside and the outside of the substrate storage container. As shown in FIG. 8, an endless eccentric wall 8 is circumferentially formed so as to render a cam around the attachment hole 7 at both sides in the rear part of the bottom plate 6. Around each eccentric wall 8 a plurality of cylindrical attachment bosses 9 are projectively formed at intervals of a predetermined distance.

Figure 9:
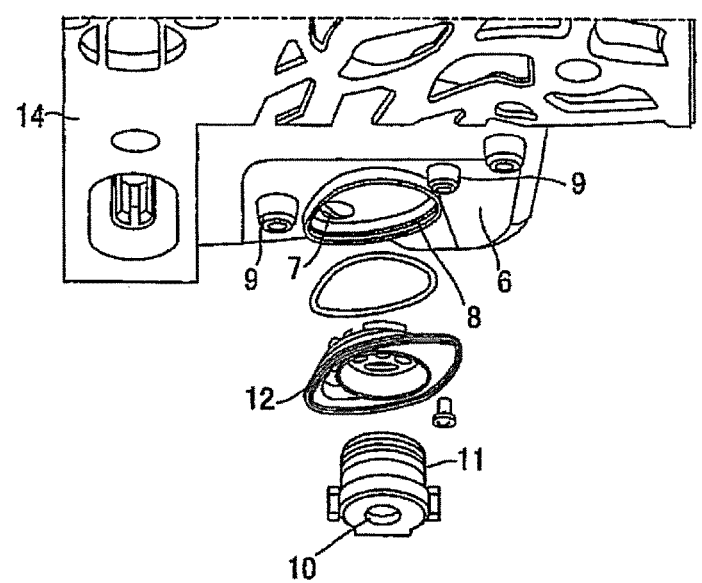
FIG. 9 A perspective exploded view from below, schematically showing an attachment hole, air feed valve, offset adaptor and the like in the container main body in the embodiment of the substrate storage container according to the present invention.

The air feed valve 10 is constructed as shown in FIG. 9 such that a valve element is incorporated in an air feed housing 11 having, for example a cylindrical form so as to be vertically movable by means of a spring and functions to supply purge gas (see arrows in FIGS. 1 and 2) to the interior of the air replacement unit 40 from the outside of the container main body 1. Fitted at the top of the air feed housing 11 is an offset adaptor 12 that is fitted into the eccentric wall 8 via an O ring. This offset adaptor 12 is screw fitted at both side thereof to a plurality of attachment bosses 9. The offset adaptor 12 is formed in a hollow projected shape of a planar approximately elliptic sphere, for example with its projected part open and inserted into the attachment hole 7 of the bottom plate 6.

The air release valve 13 basically has the same configuration as the air feed valve 10 and is hermitically fitted to the attachment hole 7 in the front part on both sides of the bottom plate 6. This air release valve 13 functions to discharge air from the inside to the outside of the container main body 1 when purge gas is fed with the door unit 30 fitted to the front 2 of the container main body 1. As the purge gas, a variety of inert gases and dry air can be mentioned.

In general, a separate base board 14 to be an interface is horizontally screw-fitted to the underside of the bottom plate 6 of the container main body 1 by meaning of screws. This base board 14 has positioning tools 15 in the front on both sides and at the center in the rear to position the container main body 1. Each positioning tool 15 is basically formed in an approximately elliptic shape, viewed from top, having an approximately V-shaped cross-section and is put with its hollowed portion defined by a pair of V-shaped inclined surfaces oriented downwards so as to make the hollowed portion fit over and into contact with the positioning pin of the load port 81, whereby the container main body 1 is positioned with high precision.

Attached attachably and detachably to the center of the ceiling plate 16 of the container main body 1 is a top flange 17 for transport, which is gripped by the overhead transport mechanism in semiconductor manufacturing plants. Locking holes for the locking mechanism 36 are bored on both sides at the top and bottom of the interior periphery of the front 2 of the container main body 1.

Figure 10:
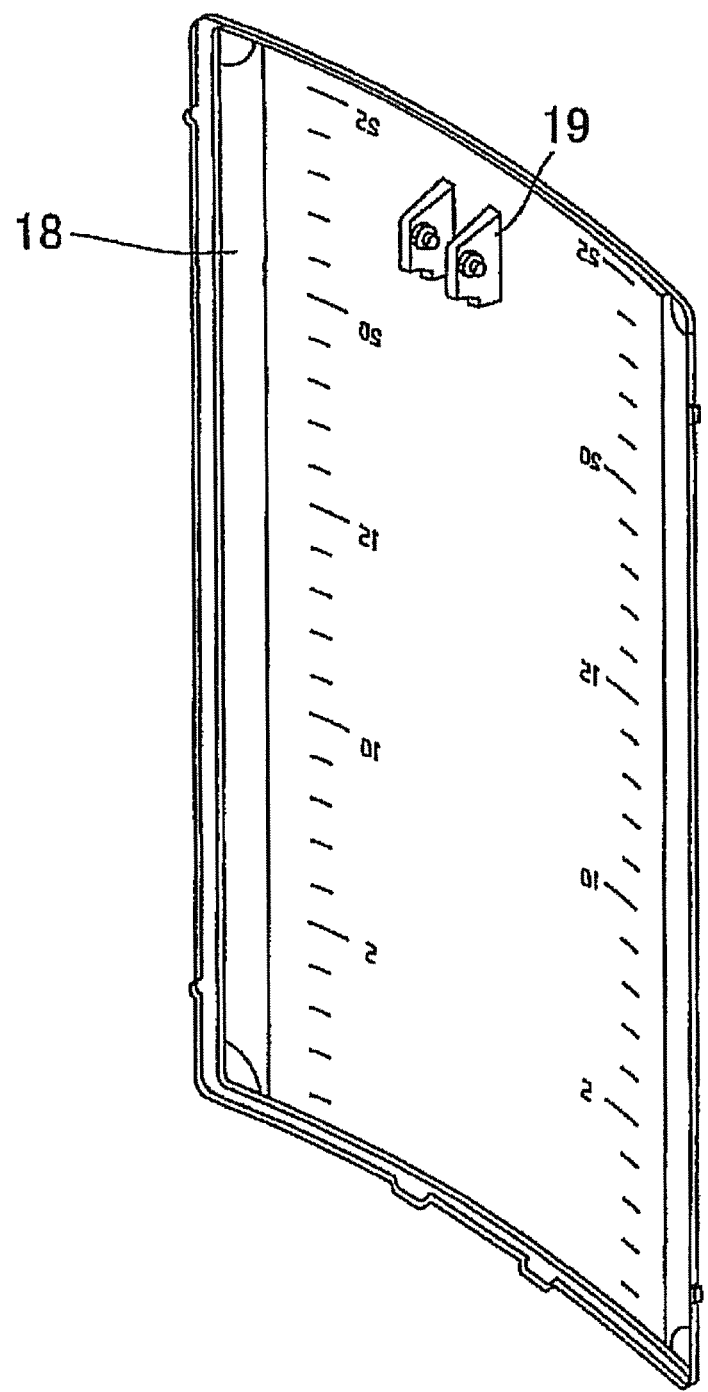
FIG. 10 A perspective illustration schematically showing a rear wall of the container main body in the embodiment of the substrate storage container according to the present invention.
Figure 11:
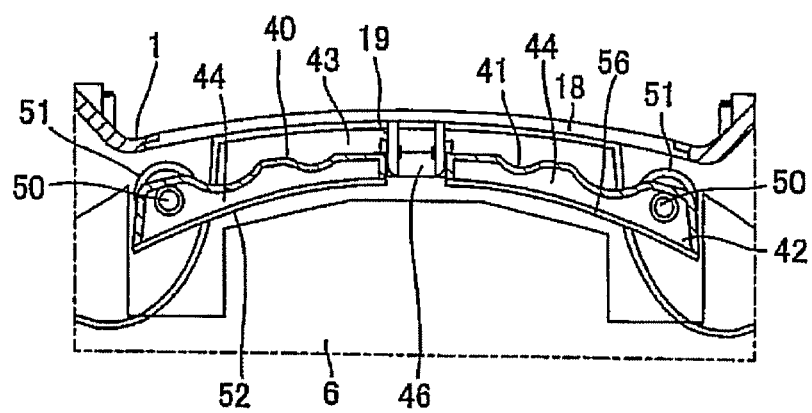
FIG. 11 A perspective illustration schematically showing a rear wall of the container main body and an air replacement unit in the embodiment of the substrate storage container according to the present invention.
Figure 12:
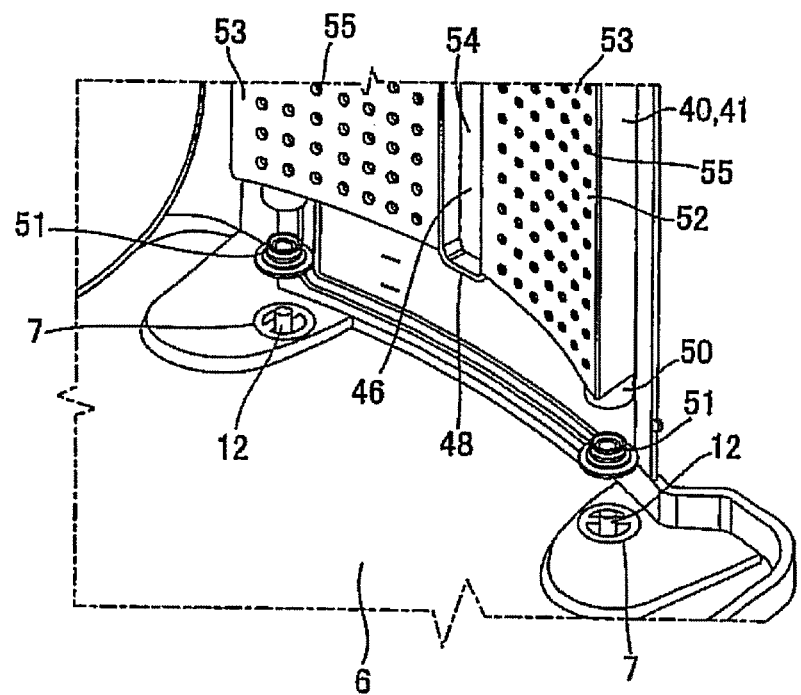
FIG. 12 A perspective illustration schematically showing a bottom plate of the container main body and an air replacement unit in the embodiment of the substrate storage container according to the present invention.
Figure 13:
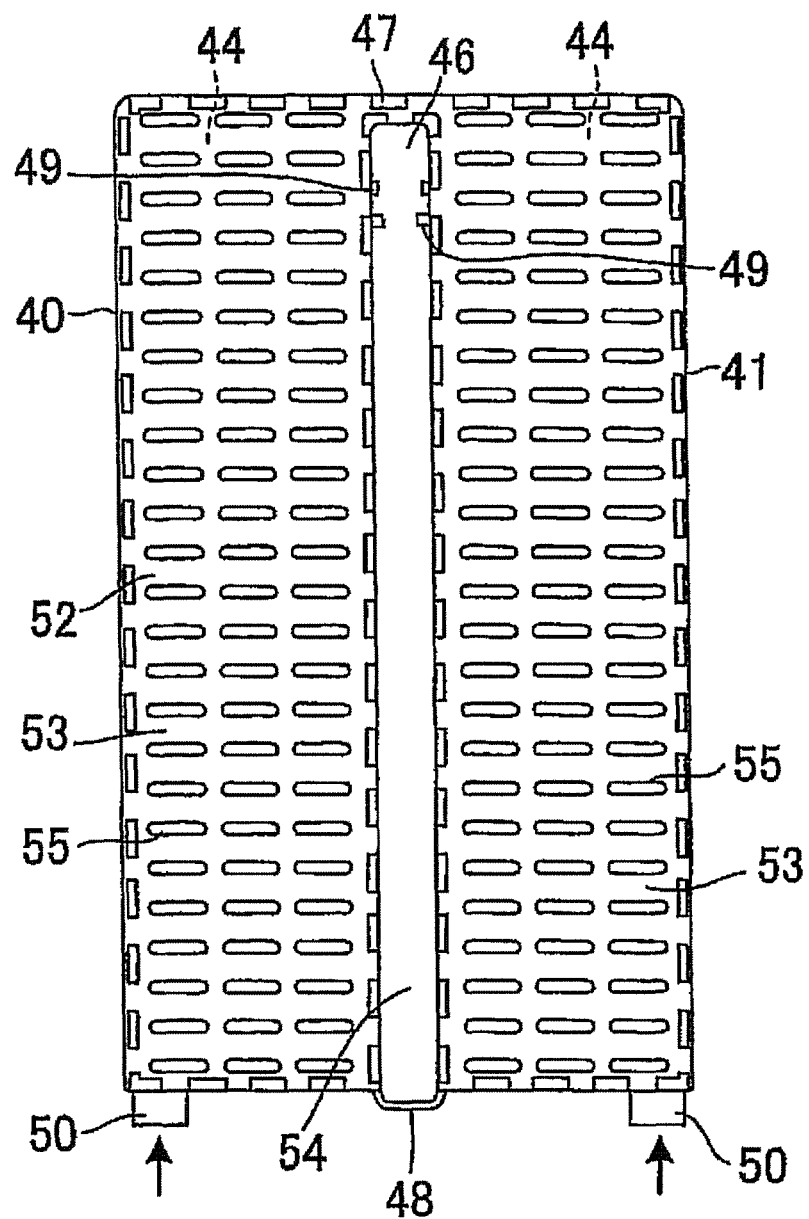
FIG. 13 A front illustration schematically showing a housing of the air replacement unit in the embodiment of the substrate storage container according to the present invention.
Figure 14:
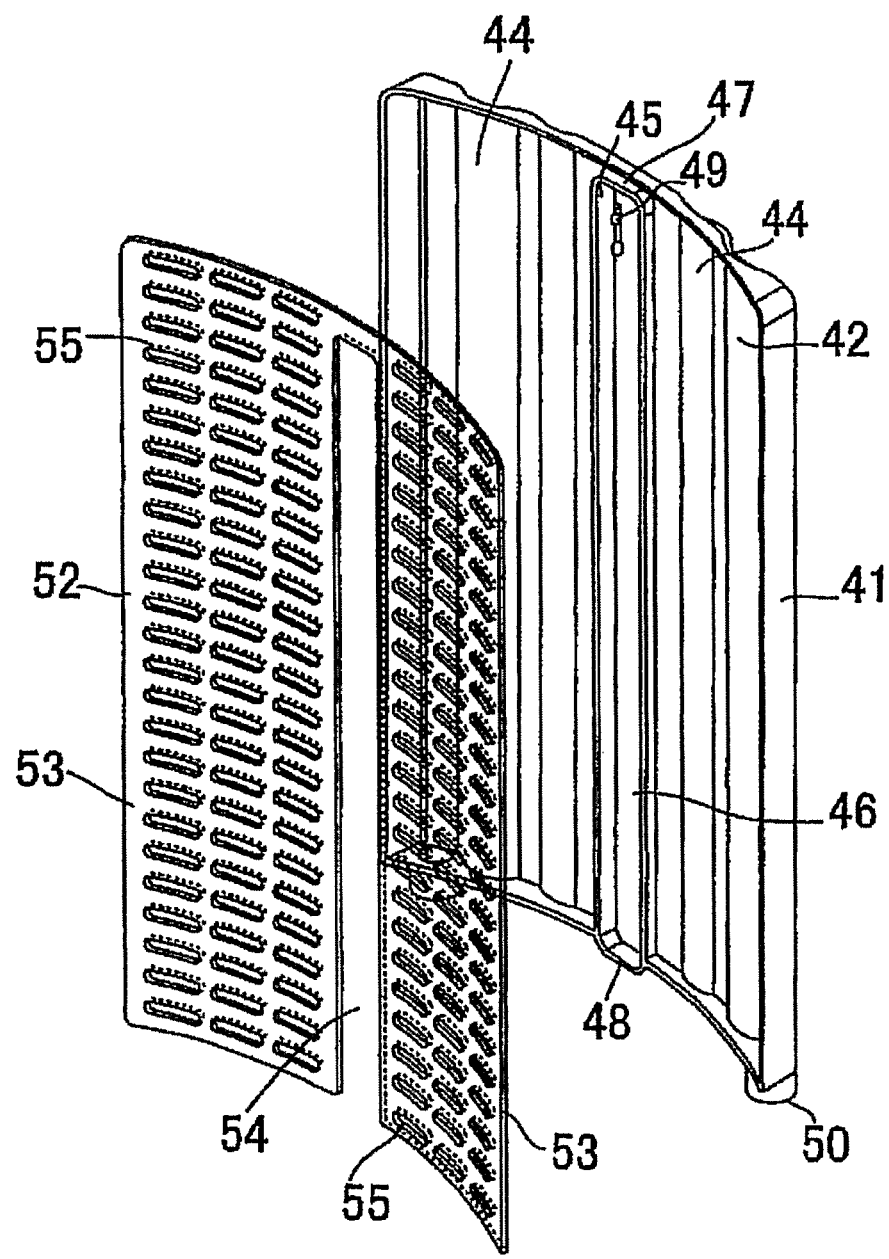
FIG. 14 A perspective exploded illustration schematically showing a housing and cover of the air replacement unit in the embodiment of the substrate storage container according to the present invention.
Figure 15:
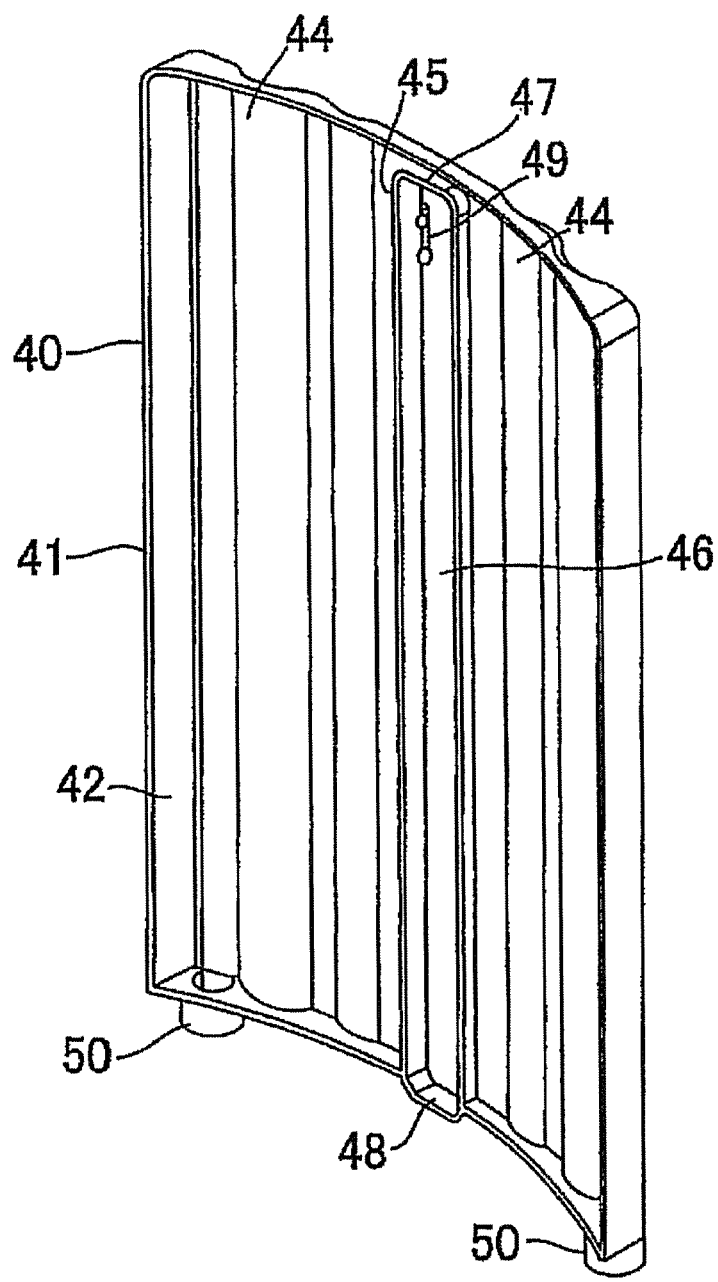
FIG. 15 A perspective illustration schematically showing the housing of the air replacement unit in the embodiment of the substrate storage container according to the present invention.

As shown in FIG. 10, the rear wall 18 of the container main body 1 is made slightly curved and transparent so that the interior of the container main body 1 can be seen. Graduations and figures convenient for storage of semiconductor wafers W are given as necessary on both sides of the inner surface. At the top center of the interior surface, a pair of left and right engaging pieces 19 for air replacement unit 40 is projectively formed toward the front 2 of the container main body 1. Thus constructed rear wall 18 of the container main body 1 is separately formed from the container main body 1 and combined by being assembled from the open back of the molded container main body 1. However, if required, the rear wall may be integrally formed or insert-formed as a part of the container main body 1 when the transparent container main body 1 is molded.

A grip 20 for holding is attachably and detachably attached in the center on the outside surface of each side wall of the container main body 1. A side rail 21 for transportation is optionally attached horizontally in the lower part on the outside surface of each side wall.

Figure 3:
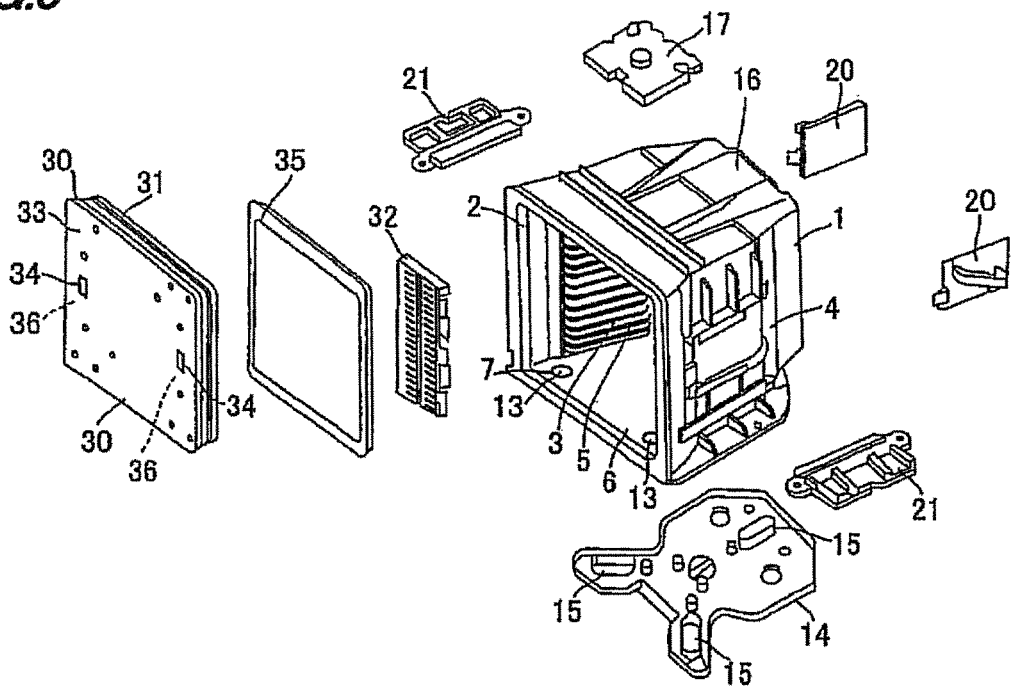
FIG. 3 A perspective exploded illustration schematically showing the embodiment of the substrate storage container according to the present invention.

The door unit 30 includes, as shown in FIGS. 3 and 4, a door body 31 to be press fitted into the open front 2 of the container main body 1; a front plate 33 covering the open front of the door body 31; and a sealing gasket 35 for hermetic sealing inserted between the inner periphery of the front 2 of the container main body 1 and the door body 31. The outer peripheral wall of the door body 31 comes in contact with the inner periphery of the open front 2 of the container main body 1. The door body 31 is formed basically in a dish-like form having a shallow profile, with a plurality of ribs for reinforcement and attachment therein while the rear surface as an opposite surface facing semiconductor wafers W is attached with a front retainer 32 for resiliently holding semiconductor wafers W.

Hollowed in the peripheral part on the rear side of the door body 31 is a frame-shaped fitting groove, into which a sealing gasket 35 to press and fit to the inner periphery of the front 2 of the container main body 1 is tightly fitted. Further, project/retract holes for the locking mechanism 36 opposite to the locking holes for the container main body 1 are formed at both sides on the upper and lower peripheral walls of the door body 31.

The front plate 33 is formed in a horizontally long rectangular shape when viewed from the front and provided with ribs, screw holes and the like for reinforcement and attachment. A pair of operating holes 34 for locking mechanism 36 are formed at both sides on the front plate 33. The sealing gasket 35 is formed in an elastically deformable frame structure by using thermoplastic elastomers such as polyester, polystyrene and poly-olefin, which are excellent in heat resistance, weather resistance, etc., as molding material.

The locking mechanism 36 comprises a pair of left and right rotary plates that are axially supported at both left and right sides in the door body 31 of the door unit 30 and turned by the operation keys of the load port 81 being inserted from the outside through the operating holes 34 of the front plate 33; a plurality of projecting/retracting plates that slide in upper and lower directions of the door unit 30 as each rotary plate is turned; and a plurality of locking claws that project and retract through project/retract holes of the door body 31 and comes into and out of contact with the locking holes of the container main body 1 as each projecting/retracting plate is slid, and is arranged between the door body 31 and the front plate 33.

As shown in FIGS. 1, 2, 4 to 6 and 11 to 18, the air replacement unit 40 includes a vertically long housing 41 that is arranged opposite to the curved rear wall 18 of the container main body 1 to reserve the purge gas flowing in through air feed valves 10; a cover 52 covering the front 42 of the housing 41; a plurality of air-permeable filters 56 disposed between the housing 41 and cover 52; and an airflow regulating plate 57 arranged inside the container main body 1 and opposite to the ceiling plate 16 from below.

The housing 41 is formed of predetermined materials in a curved dish-like shape having a shallow profile, or in a curved shallow box-like shape with the front 42 having a vertically long opening oriented to the front 2 of the container main body 1 and semiconductor wafers W. The molding material of this housing 41 is not particularly limited, but cycloolefin polymers, cycloolefin copolymers, polypropylene, polycarbonate and others can be mentioned for instance. Of these, cycloolefin polymers and cycloolefin copolymers are preferably used when the housing 41 is required to have transparency, high barrier performance, low-impurity properties and the others.

For the molding material of the housing 41, carbon black, acetylene black, carbon fibers, carbon nanotubes, carbon nanofibers and others may be added as necessary. The housing 41 may be surface-treated with conductive high-polymers such as polythiophene or polypyrole, or applied with a conductive coating to add electric conductivity. In this case, in view of dissipating static electricity, it is preferable that the container main body 1, air feed valve 10 and offset adaptor 12 are imparted with electric conductivity and the surface resistance of the housing 41 is specified to fall within the range of $10^3$ to $10^{12}\Omega$.

As shown in FIGS. 11 to 15, the housing 41 is extended vertically with respect to the container main body 1 and the curved, projected and hollowed rear wall of the housing is formed in such a size opposite to, at least, the most part of the rear wall 18. The housing is arranged opposite to the rear wall 18 of the container main body 1 and so as to form a spacing 43 for an airflow path 60 with between the inner surface of the rear wall 18. The interior of the housing 41 member has a pair of adjoining reserving spaces 44 sectioned left and right, each reserving space 44 being formed vertically long and functioning as a chamber for stabilizing the purge gas flowed in from the air feed valve 10 and producing a sound muffling effect.

A vertically long observation window 46 formed with a rib 45 to make semiconductor wafers W visible is formed to partition the paired reserving spaces 44 from top to bottom while making an upper connection 47 secure communication between the paired reserving spaces 44. This upper connection 47 between the paired reserving spaces 44 functions as a flow channel to conduct the purge gas flowed in from the air feed valves 10 from one reserving spaces 44 to the other adjacent reserving spaces 44 and make the pressure of purge gas uniform to thereby uniform the quantities of purge gas to be blown out from reserving spaces 44.

The lower connection 48 between the paired reserving spaces 44 is curvedly formed to be a thin ridge to create a reinforced joint between the adjoining reserving spaces 44. Further, a plurality of engagement pieces 49 directed rearwards are projectively formed at both sides in the upper peripheral part of the observation window 46 and engaged and held between a pair of engagement pieces 19 projected forwards from the rear wall 18 of the container main body 1 via engaging parts. This engagement of engagement pieces 49 firmly fixes the upper part of the air replacement unit 40 to the rear wall 18 of the container main body 1.

A conduit sleeve 50 for conducting purge gas to the reserving space 44 is formed projectively downwards from both ends of the lower part of the housing 41. Each conduit sleeve 50 is formed in a cylindrical form and tightly fitted by means of an elastic sealing member 51 to the top part of the offset adaptor 12 inside the attachment hole 7 of the bottom plate 6, so that the purge gas from the air feed valve 10 flows into each conduit sleeve 50. The sealing member 51 is molded into a hollow stepped form or the like of, for example a fluorine molding material, which is excellent in heat resistance, weather resistance, chemical resistance and others.

The cover 52 is formed of a predetermined material having flexibility in a shape matching with the housing 41 as shown in FIGS. 12, 14, 16, 17 and others, and joined tightly by thermal welding, ultrasonic welding or any other method along the whole peripheral edge of the open front 42 of the housing 41. The material of this cover 52 is not particular limited. Examples may be a molding or sheet of, for example cycloolefin polymers, cycloolefin copolymers, polypropylene, polycarbonate and others. Of these, sheets or film of 1 to 1.5 mm thick, made of cycloolefin polymers or cycloolefin copolymers are most preferable when the cover 52 is required to have transparency, high barrier performance, low-impurity properties and the others.

The molding material of the cover 52 may be added with carbonblack, acetylene black, carbon fibers, carbon nanotubes, carbon nanofibers and others as required. Similarly to the housing 41, this cover 52 may be also surface-treated with conductive high-polymers such as polythiophene and polypyrole, or applied with a conductive coating to add electric conductivity.

Since the conductive high-polymers can assure transparency and visibility, they are suitable when transparency and visibility are demanded. When the cover 52 is imparted with electric conductivity, it is preferable that the container main body 1, air feed valve 10 and offset adaptor 12 are also imparted with electric conductivity while the surface resistance of the cover 52 is specified to fall within the range of $10^3$ to $10^{12}\Omega$, in view of dissipating static electricity.

The cover 52 is partitioned into a pair of adjacent left and right cover sections 53 corresponding to the partitioned structure of the housing 41, each cover section 53 being formed vertically long to cover the reserving space 44 of the housing 41. A cutout 54 corresponding to the observation window 46 of the housing 41 is formed to be open between the paired cover sections 53 while the adjacent cover sections 53 are integrally joined at top. Each cover section 53 has a plurality of blow holes 55 arranged in order, vertically and horizontally for allowing the purge gas in the housing 41 to blow out towards the front 2 of the container main body 1 and come into contact with semiconductor wafers W.

The cutout 54 is formed vertically long and tightly adhered by thermal welding or ultrasonic welding or any other method to the rib 45 that projects forwards from the periphery of the observation window 46. The plurality of blow holes 55 are arranged vertically and horizontally across each cover section 53, for example in an m×n matrix so that purge gas can be blown out over a wide range and come into contact with a plurality of semiconductor wafers W. Each blow hole 55 may be formed to have a predetermined shape such as circle, ellipse, rectangle, polygon, slot-like shape, etc.

Specifically, perforations are formed of ϕ2 mm holes with a pitch of 10 mm, ϕ4 mm with a pitch of 10 mm, ϕ6 mm with a pitch of 10 mm, or ϕ3 mm holes arranged like a punched metal sheet, or 2×4 slot holes with a pitch of 10 mm, 3×8 slot holes with a pitch of 10 mm, 4×12 slot holes with a pitch of 10 mm, arranged in a plurality of rows like a sash.

Of the plurality of blow holes 55, the blow holes other than those in the top and bottom rows are adjusted in position so that purge gas will flow between a plurality of semiconductor wafers W in view of preventing stagnation of the purge gas. In contrast, the blow holes 55 in the bottom row are adjusted in position so that purge gas will not touch the underside surface of the semiconductor wafer W at the bottom row in view of preventing mixture of the clean air blown down and the blown-out purge gas. Further, the position of the blow holes 55 in the top row is adjusted so that the purge gas will not touch the upside surface of the semiconductor wafer W at the top row, in view of preventing mixture of clean air and the blown-out purge gas.

Figure 16:
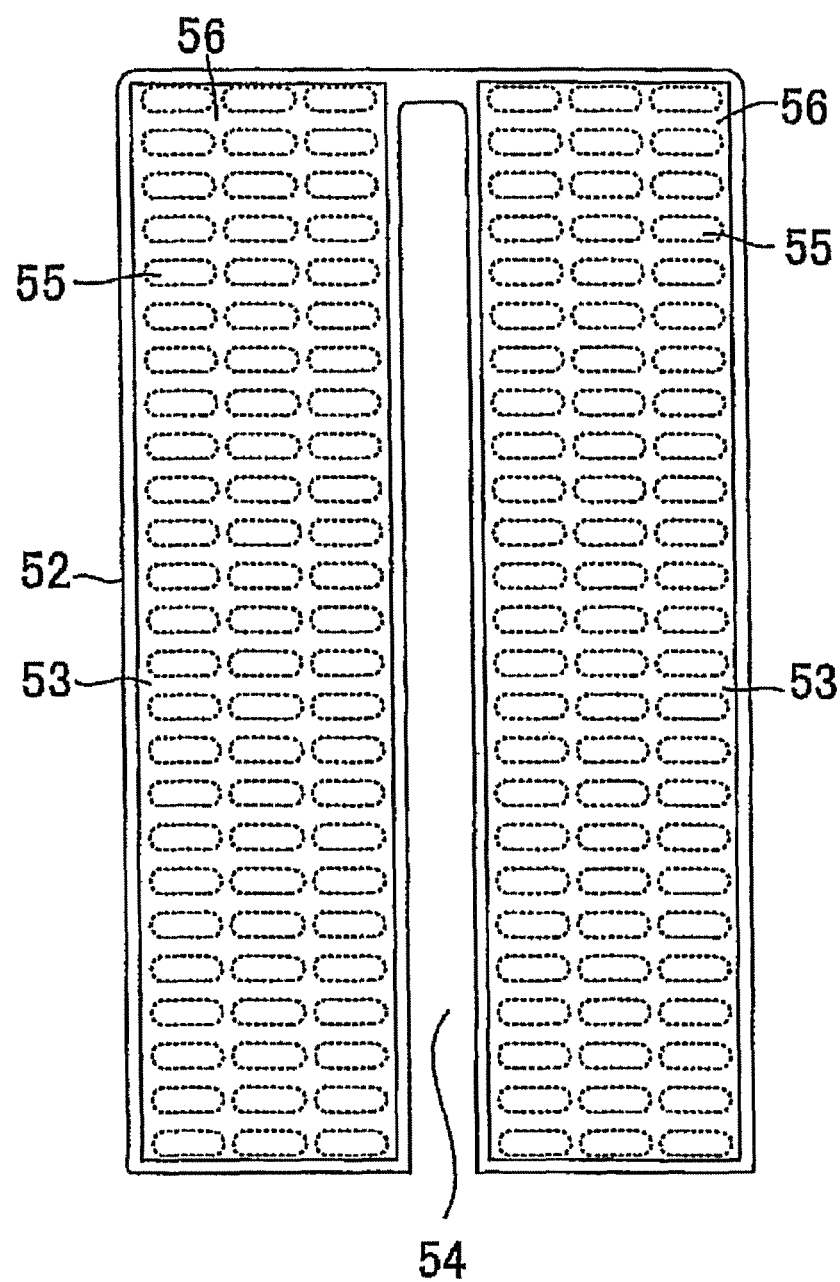
FIG. 16 A rear illustrative view schematically showing a cover and a filter of the air replacement unit in the embodiment of the substrate storage container according to the present invention.
Figure 17:
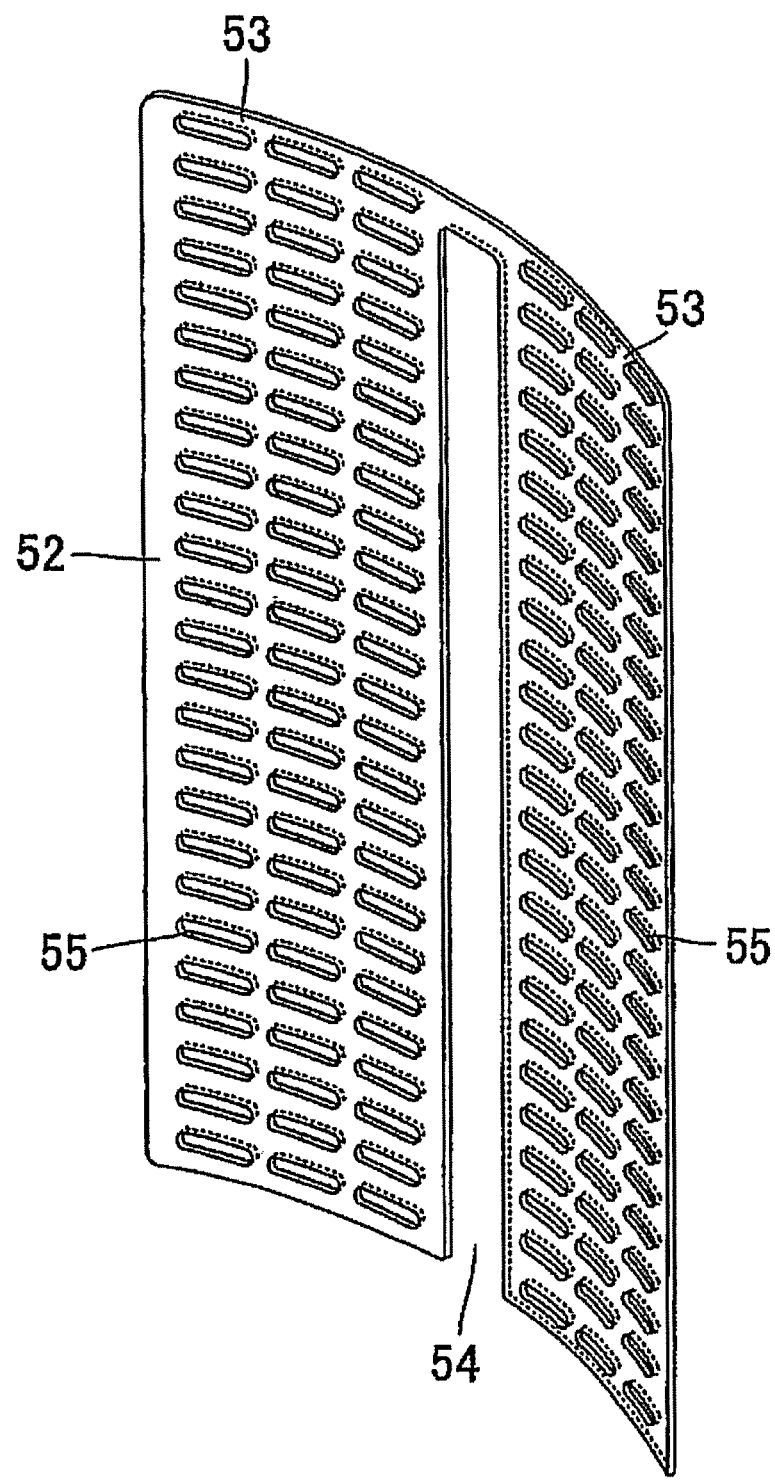
FIG. 17 A perspective illustration schematically showing the cover of the air replacement unit in the embodiment of the substrate storage container according to the present invention.
Figure 18:
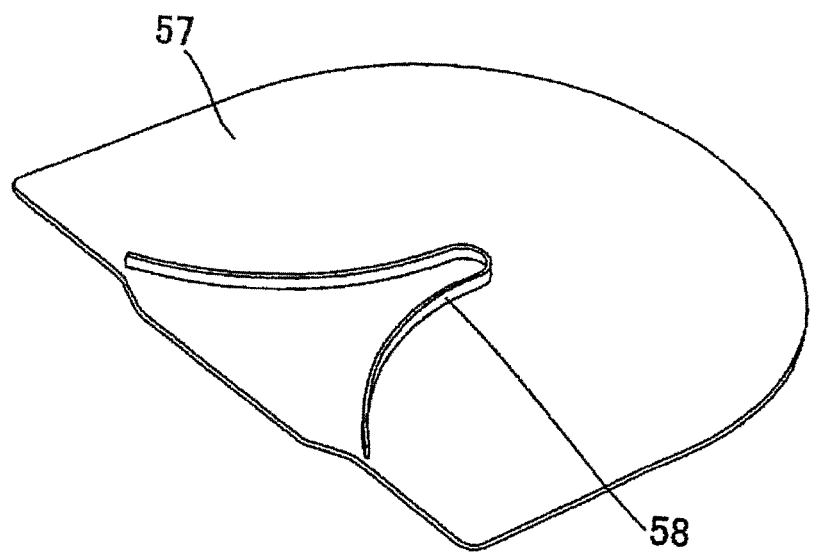
FIG. 18 A perspective illustration schematically showing an airflow regulating plate of the air replacement unit in the embodiment of the substrate storage container according to the present invention.
Figure 19:
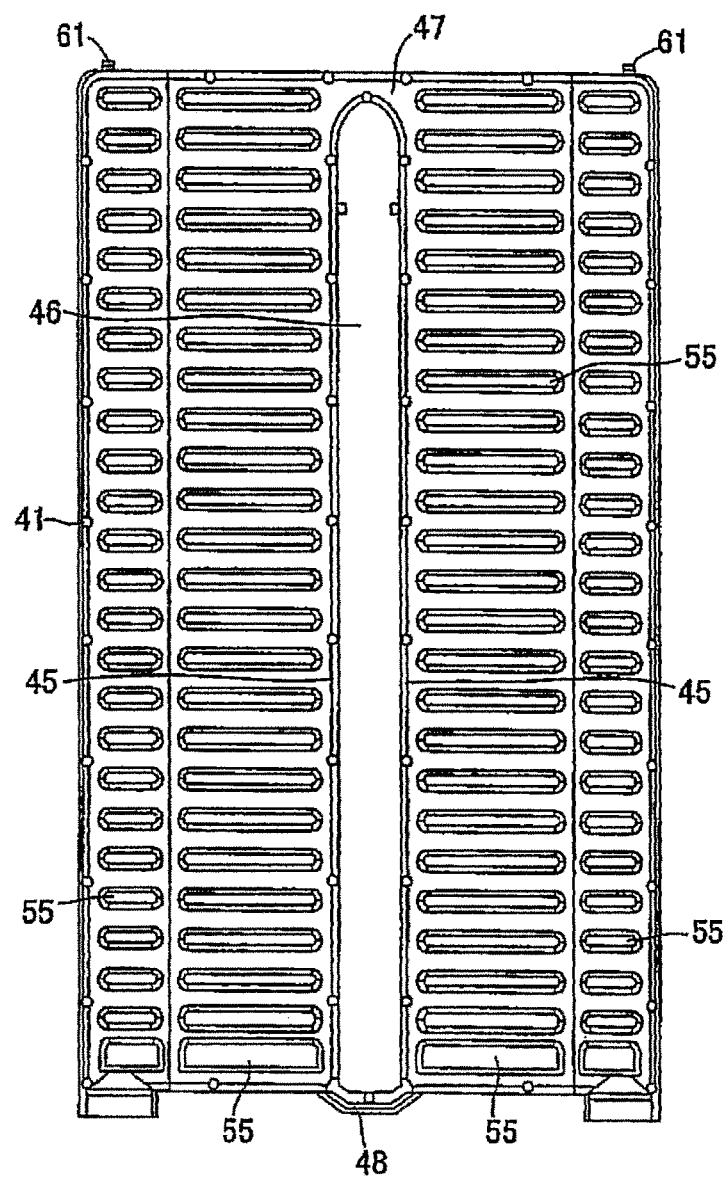
FIG. 19 An illustrative view schematically showing a housing of an air replacement unit in the second embodiment of a substrate storage container according to the present invention.
Figure 20:
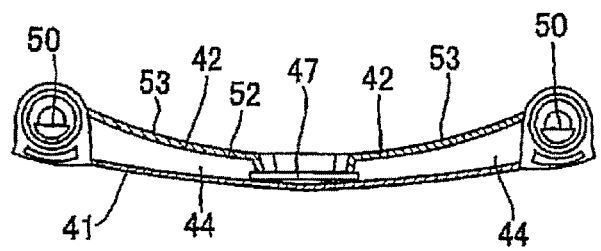
FIG. 20 A sectional illustration schematically showing the housing of the air replacement unit in the second embodiment of the substrate storage container according to the present invention.
Figure 21:
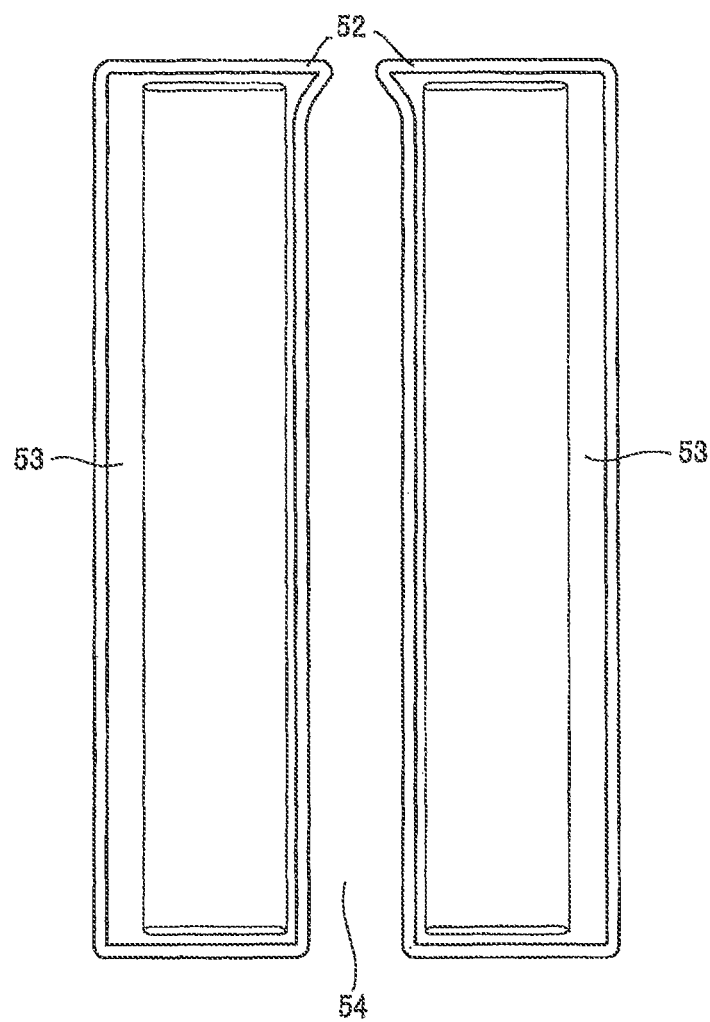
FIG. 21 An illustrative view schematically showing a cover of the air replacement unit in the second embodiment of the substrate storage container according to the present invention.
Figure 22:
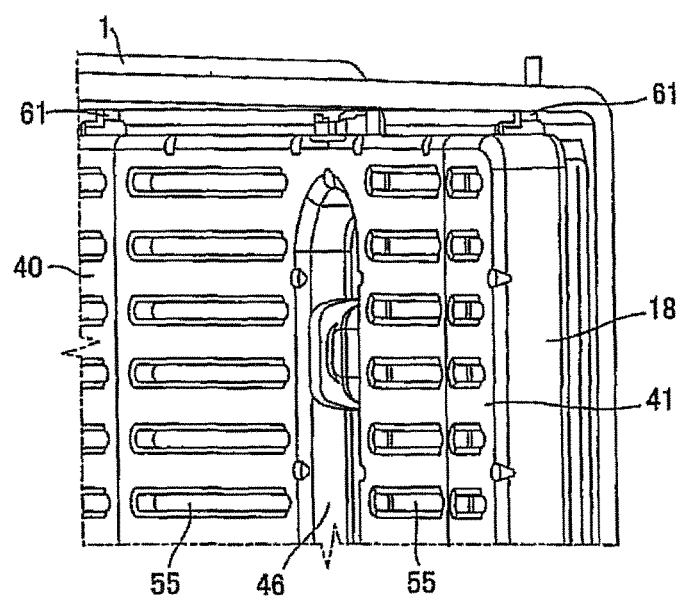
FIG. 22 A partial illustration schematically showing an example of grounding of the container main body with the housing of the air replacement unit in the second embodiment of the substrate storage container according to the present invention.
Figure 23:
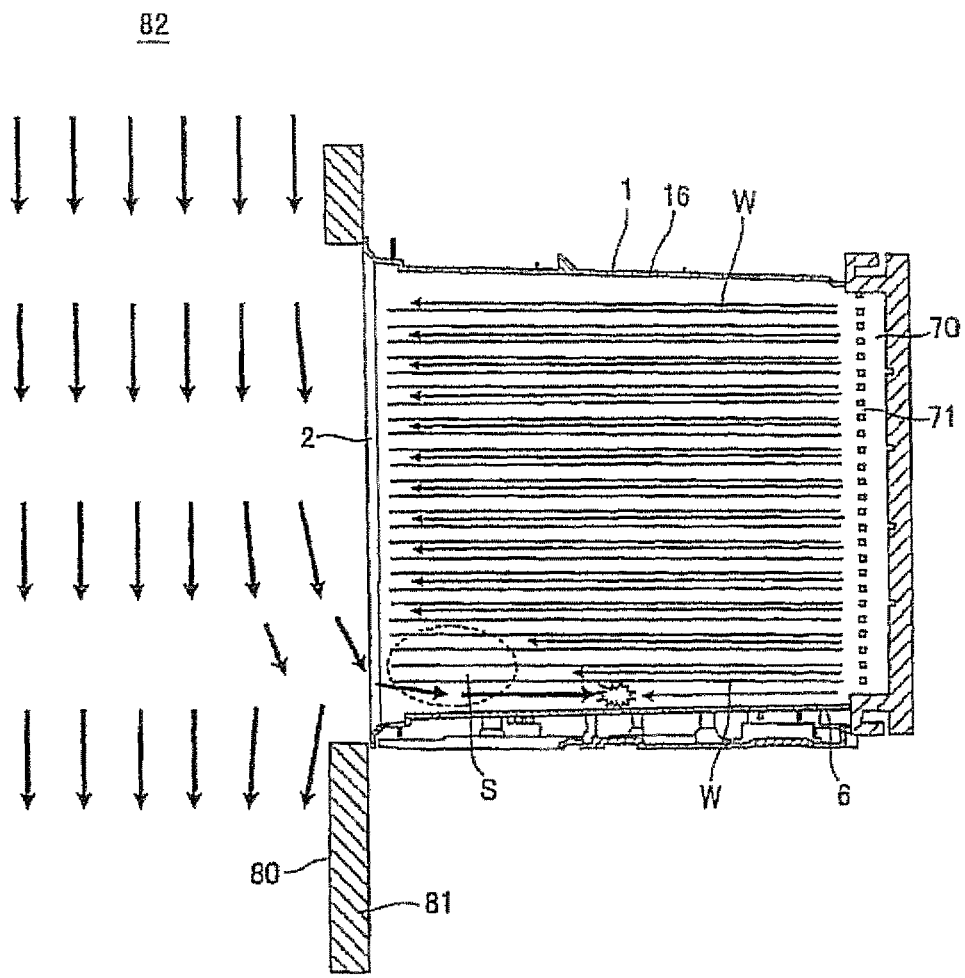
FIG. 23 A cross-sectional illustration showing the problem of stagnation being generated by collision of purge gas with clean air that flows in the lower area near the open front of a conventional container main body.
Figure 24:
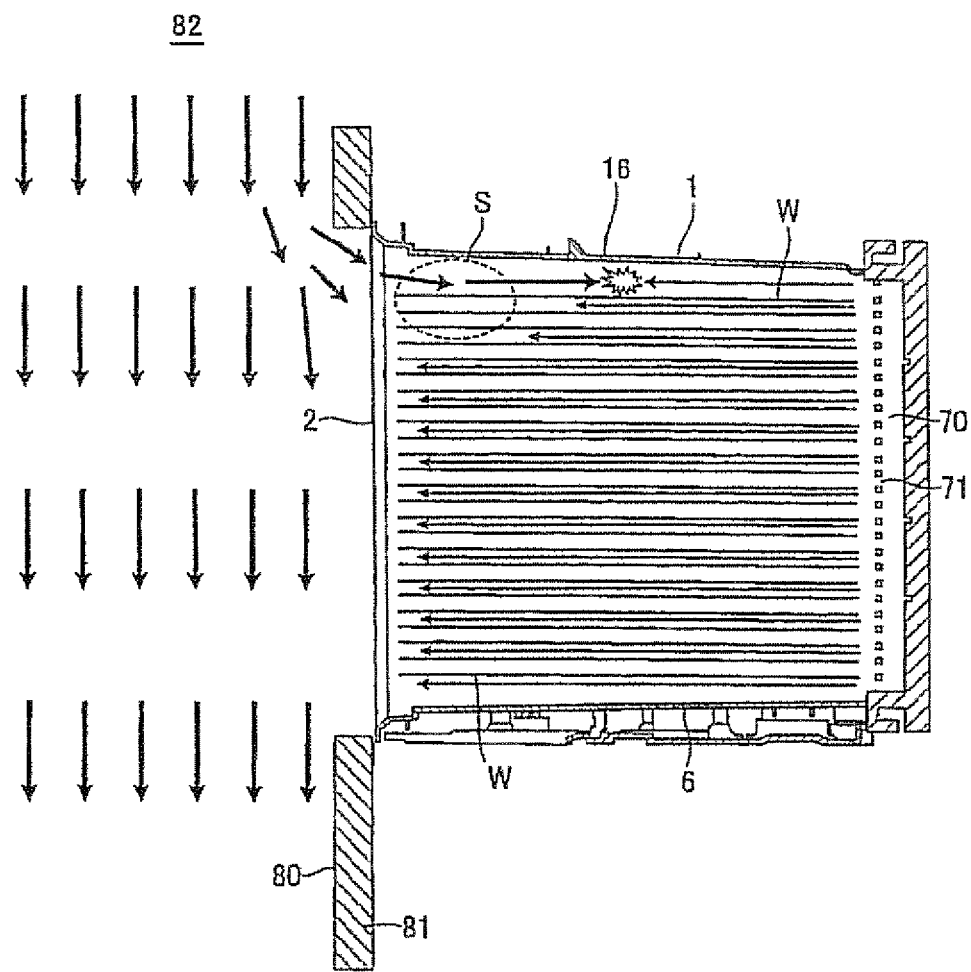
FIG. 24 A cross-sectional illustration showing the problem of stagnation being generated by collision of purge gas with clean air that flows in the upper area near the open front of the conventional container main body.

As shown in FIG. 16 and others, each filter 56 is formed of a predetermined material having flexibility, transparency or translucency, into a vertically long shape corresponding to the cover 52, and tightly adhered to the rear face of the cover 52 opposite to the front 42 of the housing 41 or more specifically to the periphery of each cover section 53 and the periphery of each blow hole 55 by thermal welding, ultrasonic welding or any other method so as to remove pollutants from the purge gas reserved in housing 41. The material of this filter 56 is not particularly limited. Examples may be combinations of polypropylene, polyester, felt, nylon 66, and saran fibers.

Since the thus formed filter 56 is welded not only the periphery of each cover section 53 but also the periphery of each blow hole 55, the filter will not flap back and forth and in other directions when purge gas is supplied, and can prevent generation of particles and the entry of the particles into the substrate storage container.

As shown in FIGS. 1, 2, 5, 6 and 18, the airflow regulating plate 57 is molded of polycarbonate, polypropylene or the like as a flat plate molding having a semicircularly curved rear part, and supported and fixed horizontally, by a pair of top-most support pieces 3 that can support a dummy wafer, or at the top of the housing 41.

The airflow regulating plate 57 is formed in a size corresponding to the ceiling plate 16 of the container main body 1 to face the topmost semiconductor wafer W from above. A guide 58 having a V-shape, in top view, is curvedly formed from the front to the center on the top surface of the airflow regulating plate 57 so as to split the airway of clean air into left and right branches and combine the airways of clean air from the left and right. The flexed part of this guide 58 is directed to the rear wall 18 of the container main body 1 or toward the housing 41.

The thus formed airflow regulating plate 57 is disposed opposite to the interior face of the ceiling plate 16 of the container main body 1 to define a clearance 59 with between the inner face of the ceiling plate 16, as shown in FIGS. 1 and 2. This clearance 59 is connected to the spacing 43 between the inner face of the rear wall 18 of the container main body 1 and the housing 41, so that these clearance 59 and spacing 43 form the airflow path 60 for clean air having an inverted L-shaped cross-section located outside the substrate storage space 5 in container main body 1.

In the above configuration, when the relative humidity in the container main body 1 of the substrate storage container is wanted to be uniformly lowered to a certain level or below by replacement with purge gas by using the EFEM 80, the container main body 1 of the substrate storage container is mounted on the load port 81 of the EFEM 80, and the door unit 30 is taken out from the front 2 of the container main body 1, then purge gas is supplied at high pressure from the outside to the inside of the container main body 1 while a large quantity of clean air is blown down toward the floor from the fan filter unit 82 of the ceiling of the EFEM 80.

As a result, part of clean air flows into the lower area near the open front of the container main body 1 and moves forwards from the front to the rear along the lower interior of the container main body 1, passing through the airflow path 60 along the rear wall 18 of the container main body 1, the airflow path 60 along the ceiling plate 16 of the container main body 1, then is split into the left and right of the container main body 1 by the flow dividing function of the guide 58 of the airflow regulating plate 57 and discharged outside to the left and right of the container main body 1 (see FIG. 1).

Upon this, part of clean air is not directly discharged out of the front of the container main body 1 but is branched toward the left and right in the front of the container main body 1, so that the air will not be pushed back by the clean air from the fan filter unit 82 and little air will return to the container main body 1.

Further, depending on the usage and surroundings of the EFEM 80, part of clean air also flows into the upper area near the open front of the container main body 1. However, the streams of clean air in this case come together in the rear part of the guide 58 by the joining function of the guide 58 of the airflow regulating plate 57, and the confluence of air moves forwards passing through the airflow path 60 along the ceiling plate 16 of the container main body 1, the airflow path 60 along the rear wall 18 of the container main body 1, then flows from the rear to the front in the lower area inside the container main body 1 and is discharged outside from the front of the container main body 1 (see FIG. 2).

On the other hand, purge gas flows into the housing 41 of air replacement unit 40 from the air feed valve 10 of the container main body 1 and reserved therein, then is blown out from the plurality of blow holes 55 of the cover 52 after passage of the filter 56 toward the open front 2 of the container main body 1, moves forwards between the plurality of semiconductor wafers W while contacting the wafers from the rear thereof. This flow of purge gas discharges air inside the container main body 1 to the outside of the front of the container main body 1 to lower the relative humidity in the container main body 1 to a certain level or below.

In this flowing process, the purge gas flows, touching the upside surface of the bottom-most semiconductor wafer W and the underside surface of the top-most semiconductor wafer W but not touching the underside surface of the bottom-most semiconductor wafer W and the top surface of the top-most semiconductor wafer W (see FIGS. 1 and 2). Accordingly, the purge gases will not collide with the clean air flowing inside the container main body 1 and hence will not mix with clean air and does not produce any stagnation S.

According to the above configuration, since purge gas is made to flow from the wide area on the rear wall 18 side of the container main body 1 towards the front, it is possible to efficiently replace the air inside container main body 1 with purge gas by preventing occurrence of collision with clean air and generation of stagnation S. Further, since the air replacement unit 40 is supported by the container main body 1 not only at the lower part and therearound but also at the upper part of the housing 41, the upper part of the air replacement unit 40 will not sway back and forth and left and right, hence the posture of the air replacement unit 40 will not become unstable even if vibrations and acceleration is applied due to supply of purge gas at high pressure from the outside to the inside of the container main body 1 or transportation of the substrate storage container at high speed, for example. Accordingly, each position of the blow holes 55 of the air replacement unit 40 will not be displaced from each original set position, hence it is possible to efficiently replace air inside the container main body 1 with purge gas.

When the relative humidity of the substrate storage container is wanted to be uniformly lowered to a certain level or below by replacement with purge gas by using the EFEM 80, a large quantity of clean air from the ceiling can be guided from the lower part inside the container main body 1 to pass through the airflow path 60 so as to detour the substrate storage space 5, and discharged to the outside from the upper part in the front of the container main body 1. Accordingly, the clean air will not flow into the lower area near the open front and collide with purge gas, hence no stagnation S will not form. As a result, purge gas can be brought to the lower part near the front of the container main body 1 to achieve efficient replacement and the relative humidity of the lower part inside the container main body 1 can be made uniform with that in the other part. Thus, it is possible to uniformly lower the relative humidity in the container main body 1 to a certain level or below.

Further, since a large quantity of clean air from the ceiling can also be discharged outside from the lower part in the front of the container main body 1 by way of the airflow path 60 and the lower interior of the container main body 1, the clean air will not flow into the upper area near the open front of the container main body 1 and collide with purge gas, hence no stagnation S will form. As a result, purge gas can be made to reach the wide space between the ceiling plate 16 of the container main body 1 and the top-most semiconductor wafer W to achieve efficient replacement and the relative humidity of the upper part inside the container main body 1 can be made uniform with that in the other part. Thus, it is possible to uniformly lower the relative humidity in the container main body 1 to a certain level or below.

Further, when the cover 52 enclosing the front 42 of the housing 41 is applied by adhesives or the like so as to be detachable instead of being welded, this can facilitate selection of a cover 52 having optimal blow holes 55 in conformity with the semiconductor manufacturing process. Since the air feed valve 10 and the conduit sleeve 50 of the housing 41 are connected by means of the offset adaptor 12 and sealing member 51, it is possible to reliably connect and fix them even if, for example the air feed valve 10 and the conduit sleeve 50 of the housing 41 are located apart and eccentric from each other. Moreover, use of the elastic sealing member 51 makes it possible to facilitate connection and fixture and create sealing easily.

If, of the air replacement unit 40, the housing 41 and cover 52 are formed of electrical conducting material, static electricity can be dissipated. Accordingly, it is possible to effectively prevent the air replacement unit 40 from being built up with static charge due vibrations accompanied by ejection of purge gas and hence prevent increase of particles. This prevention against increase of particles makes it possible to effectively exclude the risk of pollution of semiconductor wafers W. Further, since the static electricity built up through the contact portions (such as engagement pieces 49 etc.) between the container main body 1 and the air replacement unit 40 can be grounded to the outside via the container main body 1, it is possible to further reduce particles.

Next, FIGS. 19 to 22 show the second embodiment of the present invention. In this case, the open front 42 of the housing 41 of the air replacement unit 40 is directed toward the curved rear wall 18 of the container main body 1 while the closed rear wall of the housing 41 is directed toward the front 2 of the container main body 1. A plurality of blow holes 55 are arranged and perforated in the closed rear wall of the housing 41 while the front 42 of the housing 41 is covered with an unperforated cover 52.

The container main body 1 and the air replacement unit 40 are each imparted with electrical conductivity while small contact projections 61 for establishing conducting contact between the container main body 1 and the air replacement unit 40 are formed in, at least, one of the rear wall 18 of the container main body 1, the top of housing 41 at both sides and the top of cover 52 at both sides.

The cover 52 is divided into a pair of adjacent left and right cover sections 53 corresponding to the sectional configuration of the housing 41 so that each cover section 53 is formed vertically long to cover the reserving space 44 of the housing 41. Other components are the same as those in the above embodiment, so that description is omitted.

Also in this embodiment, the same operation and effect as that of the above embodiment can be expected. Besides, since not the cover 52 but the rear wall of the housing 41 is perforated with a plurality of blow holes 55, it is obvious that the configuration of the air replacement unit 40 can be diversified.

The plurality of support pieces 3 in the above embodiments may be formed integrally on the inner surface of both side walls of the container main body 1, or may be attachably and detachably attached from the rear and positioned to the inner surface of both side walls of the container main body 1. Further, though in the above embodiments a single air replacement unit 40 is placed opposite to the rear wall 18 of the container main body 1, a plurality of air replacement units 40 may be arranged opposite to the rear wall 18 of the container main body 1 while a space may be created between the air replacement units as an observation window 46 that makes semiconductor wafers W visible.

Moreover, the housing 41 may be formed in a size opposite to the entire area of the rear wall 18 of the container main body 1, or may be formed in a size opposite to a part of the rear wall 18 of the container main body 1. Further, paired reserving spaces 44 may be connected at bottom by bottom connection 48 or may be connected at both top and bottom.

Though the upper part of the air replacement unit 40 is supported by and fixed to the rear wall 18 of the container main body 1 by engaging the engagement pieces 49 at both sides of the top peripheral edge of the observation window 46 with the engagement pieces 19 projected from the rear wall 18 of the container main body 1, support and fixture is not limited to this. For example, the center of the air replacement unit 40 may be supported by and fixed to the rear wall 18 of the container main body 1 by engaging the engagement pieces 49 on both sides at the middle of the side peripheral edges of the observation window 46 with the engagement piece 19 projected from the rear wall 18 of the container main body 1. Alternatively, the top and middle of the air replacement unit 40 may be supported by and fixed to the rear wall 18 of the container main body 1 by making engagement pieces 49 project on both sides at the top and middle parts of the periphery of the observation window 26.

A conduit sleeve 50 for purge gas may be projectively formed at one side of the bottom of the housing 41, and the conduit sleeve 50 may be fitted and connected to the top of offset adaptor 12 through a sealing member 51. When the air feed valve 10 is concentric with the conduit sleeve 50 of the housing 41, the offset adaptor 12 and sealing member 51 may be omitted.

Also, the conduit sleeve 50 of the housing 41 may be formed in a variety of shapes such as polygons and other shapes. By making both side parts of the housing 41 support an airflow regulating member that extends aslant toward the rear part in the side wall of the container main body 1 with the front end of the air flow regulating member kept a clearance apart from but made close to the inner surface of the rear part of the side wall of the container main body 1, it is possible to use this clearance as the airflow path 60 for clean air or as a flow path for rinsing using a cleaning solution. Moreover, the cover 52 may be formed of a resin molding of various resins, instead of a flexible sheet.

INDUSTRIAL APPLICABILITY

The substrate storage container according to the present invention can be used in the field of manufacture of semiconductors, liquid crystal displays and others.

DESCRIPTION OF REFERENCE NUMERALS

1 container main body
2 front
3 support piece
5 substrate storage space
6 bottom plate (bottom)
7 attachment hole
10 air feed valve
13 air release valve
16 ceiling plate (ceiling)
18 rear wall
19 engagement piece
30 door unit
36 locking mechanism
40 air replacement unit
41 housing (housing member)
42 front
43 spacing
44 reserving space
46 observation window
47 upper connection between a pair of reserving spaces (upper connection between a plurality of reserving spaces)
48 lower connection between a pair of reserving spaces (lower connection between a plurality of reserving spaces)
49 engagement piece
50 conduit sleeve
52 cover (covering member)
53 cover section
54 cutout
55 blow hole
56 filter (filtering member)
57 airflow regulating plate (airflow regulating member)
59 clearance
60 airflow path
61 contact projection
80 EFEM
82 fan filter unit
S stagnation
W semiconductor wafer (substrate)

The invention claimed is:

1. A substrate storage container comprising:
a container main body comprising a plurality of pairs of support pieces capable of accommodating a plurality of substrates;
an air feed valve for supplying a substrate protecting gas from an outside of the container main body to an inside of the container main body; and,
an air replacement unit configured to blow out the substrate protecting gas from the air feed valve into the inside of the container main body; and
an air flow path,
wherein the container main body has a front open box form with the air feed valve attached at a bottom in a rear part of the container main body,
wherein the air replacement unit includes a housing member for reserving the substrate protecting gas flowed in through the air feed valve and a covering member that covers an open face of the housing member,
wherein a bottom of the housing member is connected to the air feed valve so as to flow the substrate protecting gas,
wherein the covering member is formed with a plurality of blow holes for blowing the substrate protecting gas in the housing member toward a front of the container main body, and
wherein a space is formed between the air replacement unit and an inner face of a rear wall of the container main body,
wherein the air flow path comprises the space and a clearance, the clearance defined between an inner face of a ceiling of the container main body and an airflow regulating member that faces the ceiling, and
wherein the air flow path is communicated with a lower area inside the container main body.

2. The substrate storage container according to claim 1, wherein the open face of the housing member of the air replacement unit is formed to be open, and the open face of the housing member is directed toward the front of the container main body and covered with the covering member while the plurality of blow holes are formed in the covering member.

3. The substrate storage container according to claim 2, wherein the container main body is formed to be able to accommodate a plurality of substrates arranged over one another, and at least, a rear wall of the container main body is made transparent,
the housing member of the air replacement unit is formed to extend in a vertical direction of the container main body and sized so as to be able to face, at least, part of the rear wall of the container main body,
an interior of the housing member is sectioned into a plurality of reserving spaces,
an observation window for inspection of substrates formed between the plurality of reserving spaces,
the plurality of reserving spaces are connected at at least one of an upper position and a lower position so as to allow the substrate protecting gas to flow, and,
the covering member of the air replacement unit is formed with a cutout corresponding to the observation window of the housing member and has the plurality of blow holes arrayed vertically and horizontally of the covering member.

4. The substrate storage container according to claim 1, wherein at least one of a top and a middle of the housing member of the air replacement unit is supported by an interior of the container main body.

5. The substrate storage container according to claim 1, wherein the air replacement unit is formed of electrical conducting material and a connecting portion of the air replacement unit coming into contact with the container main body enables static electricity on the air replacement unit to be grounded to the outside of the container main body.

6. The substrate storage container according to claim 1, wherein the air replacement unit is formed of electrical conducting material and a surface resistance of the air replacement unit is specified to fall within a range of $10^3$ to $10^{12} \Omega$.

7. The substrate storage container according to claim 1, wherein the air replacement unit includes an air permeable filtering member interposed between the housing member and the covering member.

* * * * *